US009167274B1

(12) United States Patent
Gu et al.

(10) Patent No.: US 9,167,274 B1
(45) Date of Patent: Oct. 20, 2015

(54) GENERATING SYNCHRONIZED DICTIONARIES FOR SPARSE CODING

(75) Inventors: Qunshan Gu, Hayward, CA (US); Ronghua Wu, Albany, CA (US)

(73) Assignee: GOOGLE INC., Mountain View, CA (US)

(*) Notice: Subject to any disclaimer, the term of this patent is extended or adjusted under 35 U.S.C. 154(b) by 737 days.

(21) Appl. No.: 13/426,127

(22) Filed: Mar. 21, 2012

(51) Int. Cl.
H04N 7/50 (2006.01)
H04N 19/97 (2014.01)
G06N 3/04 (2006.01)

(52) U.S. Cl.
CPC ............ H04N 19/97 (2014.11); *G06N 3/049* (2013.01)

(58) Field of Classification Search
CPC ... H03M 7/30; H03M 7/3082; H03M 7/4018; H03M 7/46; H03M 7/42; H03M 7/48; G06F 17/30705; G06F 11/3447; G06F 15/16; G06F 17/11; G06F 17/14; G06F 17/16; G06F 17/30; G06F 17/30017; G06F 17/30067; G06F 17/30247; H04N 5/335; H04N 19/00975; H04N 19/00775; H04N 19/00084; H04N 19/00278; H04N 19/00818; H04N 7/26989; H04N 19/00012; H04N 19/00024; H04N 19/00175; H04N 19/00212
USPC .......... 348/418.1, 420.1, 187, 169, 143, 344, 348/355, 222.1; 382/117, 118, 163, 164, 382/166, 170, 176, 199, 205, 238, 241, 382/245; 375/240.01–240.24
See application file for complete search history.

(56) References Cited

U.S. PATENT DOCUMENTS 5,867,114 A 2/1999 Barbir
7,783,459 B2 8/2010 Rozell et al.
2007/0195743 A1 8/2007 Karaoguz
2008/0170623 A1 7/2008 Aharon et al.
2011/0228920 A1 9/2011 Kagawa et al.
2012/0057799 A1* 3/2012 Nguyen et al. ................ 382/232

(Continued)

FOREIGN PATENT DOCUMENTS

WO WO9957900 A1 11/1999

OTHER PUBLICATIONS

Y-Lan Boureau, et al., Learning Mid-Level Features for Recognition, 8 pages. Courant Institute, New York University, NY.

(Continued)

*Primary Examiner* — Behrooz Senfi
(74) *Attorney, Agent, or Firm* — Young Basile Hanlon & MacFarlane P.C.

(57) ABSTRACT

Techniques for generating synchronized dictionaries for sparse coding to facilitate encoding of video content are presented. An encoder can generate a dictionary that can be synchronized with a corresponding dictionary maintained by a decoder. The encoder can use the dictionary to facilitate encoding video content, based on sparse coding, for transmission to the decoder. During a video session, the encoder and decoder can signal each other to identify common dictionaries between the encoder and decoder, wherein desired common dictionaries can be used for coding content. During a session, the decoder can dynamically select visual images that can be used to dynamically add new elements to the corresponding dictionary. The decoder can provide identifying information regarding these visual images to the encoder. The encoder can select corresponding visual images to add to its dictionary to maintain the synchronization of these common dictionaries.

22 Claims, 11 Drawing Sheets

(56) References Cited

U.S. PATENT DOCUMENTS

2012/0106627 A1* 5/2012 Guo et al. ............. 375/240.02
2012/0163451 A1* 6/2012 Cohen et al. ........... 375/240.12
2013/0223523 A1* 8/2013 Moghadam et al. ..... 375/240.03

OTHER PUBLICATIONS

Y-Lan Boureau, et al., A Theoretical Analysis of Feature Pooling in Visual Recognition, 8 pages, Courant Institute of Mathematical Sciences New York University, NY 10003.

Julien Mairal, et al., Online Dictionary Learning for Sparse Coding, Jun. 2008, 34 pages, Inria-Willow project, Ecole Normale Superieure University of Minnesota, ICML, Montreal.

Jinjun Wang et al., Locality-constrained Linear Coding for Image Classification, 8 pages, Akiira Media System, Palo Alto, CA, Beckman Institute, University of Illinois at Urbana-Champaign, NEC Laboratories America, Inc., Cupertino, CA.

Jianchao Yang, et al., Linear Spatial Pyramid Matching Using Sparse Coding for Image Classification, 8 pages, Beckman Institute, University of Illinois at Urbana-Champaign, NEC Laboratories America, Cupertino, CA 95014, USA.

Jianchao Yang, et al., Efficient Highly Over-Complete Sparse Coding Using a Mixture Model, 14 pages, Beckman Institute, University of Illinois at Urbana Champaign, IL, NEC Laboratories America, Cupertino, CA.

Jianchao Yang, et al., Supervised Translation-Invariant Sparse Coding, 8 pages, Beckman Institute, University of Illinois at Urbana-Champaign, NEC Laboratories America, Inc., Cupertino CA.

Xiao-Tong Yuan, et al., Visual Classification With Multi-Task Joint Sparse Representation, 8 pages, Department of Electrical and Computer Engineering, National University of Singapore, Singapore.

Xi Zhou, et al., Image Classification Using Super-Vector Coding of Local Image Descriptors, 14 pages, Dept. of ECE, University of Illinois at Urbana-Champaign, Illinois, NEC Laboratories America, CA, Department of Statistics, Rutgers University, New Jersey.

Christophe De Vleeschouwer, Matching Pursuits Video Coding: Subband Dictionaries and Bit Allocation Methodologies, Aug. 1999, 246 pages, Laboratoire De Telecommunications Et Teledetection, B-1348 Louvain-la-Neuve, Belgique, Universite Catholique de Louvain.

Gianluca Monaci, et al., Learning Bimodal Structure in Audio-Visual Data, 13 pages.

Ignacio Ramirez, et al., Classification and Clustering Via Dictionary Learning With Structured Incoherence and Shared Features, 8 pages, Electrical and Computer Engineering, University of Minnesota.

Monaci, G., et al., Learning Multimodal Dictionaries, 1 page, Sep. 2007, IEEE Xplore Digital Library, vol. 16 Issue:9, http://ieeexplore.ieee.org/xpl/freeabs_all.jsp?arnumber=4287000&tag=1.

De Vleeschouwer Christophe, Matching pursuits video coding : subband dictionaries and bit allocation methodologie, Laboratoire De Telecommunications Et Teledetection, 2 pages, No. 1240, 1999, http://www.tele.ucl.ac.be/view-publication.php?language=Fr&id=1240.

Francis Bach, et al., Tutorial on Sparse Coding and Dictionary Learning for Image Analysis, CVPR 2010, CVPR 2010 Tuturial, 4 pages, Jun. 14, 2010.

Francis Bach, et al, ICCV Tutorial on Sparse Coding and Dictionary Learning for Image Analysis, ICCV 2009 Tutorial, 4 pages, Sep. 28.

Jiang, et al., "Learning a Discriminative Dictionary for Sparse Coding via Label Consistent K-SVD," 8 pages.

Mairal, et al., "Online Dictionary Learning for Sparse Coding," 8 pages.

Bach, et al., "Sparse Coding and Dictionary Learning for Image Analysis Part II: Dictionary Learning for signal reconstruction," ICCV'09 tutorial, Sep. 28, 2009, 43 pages, Kyoto.

Yaghoobi, et al., "Parametric Dictionary Design for Sparse Coding," IEEE Transaction on Signal Processing, 11 pages.

* cited by examiner

GENERATING SYNCHRONIZED DICTIONARIES FOR SPARSE CODING

TECHNICAL FIELD

This disclosure relates generally to video processing, and more specifically to generating synchronized dictionaries for sparse coding.

BACKGROUND

The amount of data representing media information, such as a still image and video image, can be extremely large. Further, transmitting digital video information over communication networks can consume large amounts of bandwidth. The cost of transmitting data from one location to another can be a function of number of bits transmitted per second. Typically, higher bit transfer rates are associated with increased cost. Higher bit rates also can progressively add to required storage capacities of memory systems, which can thereby increase storage cost. Thus, at a given quality level, it can be much more cost effective to use fewer bits, as opposed to more bits, to store digital images and videos. It therefore can be desirable to compress media data for recording, transmitting, or storing.

For a typical compression scheme, achieving higher media quality can require that more bits be used, which can, in turn, increase cost of transmission and/or storage. While lower bandwidth traffic may be desired so may higher quality media.

An encoder is a device capable of encoding (e.g., coding), and sometimes also decoding, digital media data. A decoder is a device capable of decoding digital media data. A codec is a device capable of coding and/or decoding digital media data. The term codec is derived from a combination of the terms code and decode, or the terms compress and decompress. A variety of codecs are commercially available. Codec classifications can include, for example, discrete cosine transfer codecs, fractal codecs, and wavelet codecs. An encoder or codec, by encoding the digital media data, can reduce the number of bits required to transmit signals, which can thereby reduce associated transmission costs.

Sparse coding is a coding technique that is potentially useful in improving video compression coding efficiency. In sparse coding, there can be a dictionary of elements, which may be trained based on offline images or video frames. The dictionary elements can be used to facilitate coding (e.g., sparse coding) of video content. Generally, the more accurate a dictionary is in representing video content to be coded, the more useful sparse coding can be in compressing the video content. Conversely, the less accurate a dictionary is in representing the video content to be coded, the more diminished the value of sparse coding may be in compressing the video content. Conventional dictionaries trained from generic images or video frames can be less optimal or accurate with regard to representing video content to be coded, may not be able to cover a wide variety of video compression scenarios, and can be inefficient in compressing video content.

SUMMARY

The following presents a simplified summary of various aspects of this disclosure in order to provide a basic understanding of such aspects. This summary is not an extensive overview of all contemplated aspects, and is intended to neither identify key or critical elements nor delineate the scope of such aspects. Its purpose is to present some concepts of this disclosure in a simplified form as a prelude to the more detailed description that is presented later.

Systems and methods disclosed herein relate to coding (e.g., encoding, decoding) video content based at least in part on sparse coding. Disclosed herein is a system for encoding video content. The system can include a near-end encoder component configured to encode the video content. The system also can include a near-end dictionary management component configured to identify one or more dictionaries that the near-end encoder component has in common with a far-end decoder component to synchronize common dictionaries between the near-end encoder component and the far-end decoder component, based at least in part on respective unique identifiers associated with respective dictionaries, to facilitate the encoding of the video content, wherein the one or more dictionaries facilitate the encoding of the video content based at least in part on sparse coding.

Also disclosed herein is a method for encoding video content. The method includes employing at least one processor to facilitate execution of code instructions retained in at least one memory device. The at least one processor, in response to execution of the code instructions, performs acts comprising: identifying a subset of dictionaries that a near-end encoder has in common with a far-end decoder to synchronize common dictionaries between the near-end encoder and the far-end decoder, based at least in part on respective unique identifiers associated with respective dictionaries of the near-end encoder and the far-end decoder; and encoding the video content using sparse coding based at least in part on the subset of dictionaries.

Further disclosed herein is a system for encoding video content. The system can include means for identifying a subset of dictionaries that a near-end encoder has in common with a far-end decoder to identify and synchronize common dictionaries between the near-end encoder and the far-end decoder, based at least in part on respective unique identifiers associated with respective dictionaries of the near-end encoder and the far-end decoder. The system also can contain means for encoding the video content using sparse coding based at least in part on the subset of dictionaries.

Also disclosed herein is a system for decoding video content. The system can include a far-end decoder component configured to decode the encoded video content received from a near-end encoder component. The system also includes a far-end dictionary management component configured to identify one or more dictionaries that the far-end decoder component has in common with the near-end encoder component to synchronize common dictionaries between the far-end decoder component and the near-end encoder component, based at least in part on respective unique identifiers associated with respective dictionaries, to facilitate the decoding of the encoded video content, wherein the one or more dictionaries facilitate the decoding of the encoded video content based at least in part on sparse coding.

The following description and the annexed drawings set forth in detail certain illustrative aspects of this disclosure. These aspects are indicative, however, of but a few of the various ways in which the principles of this disclosure may be employed. This disclosure is intended to include all such aspects and their equivalents. Other advantages and distinctive features of this disclosure will become apparent from the following detailed description of this disclosure when considered in conjunction with the drawings.

DETAILED DESCRIPTION

Figure 1:
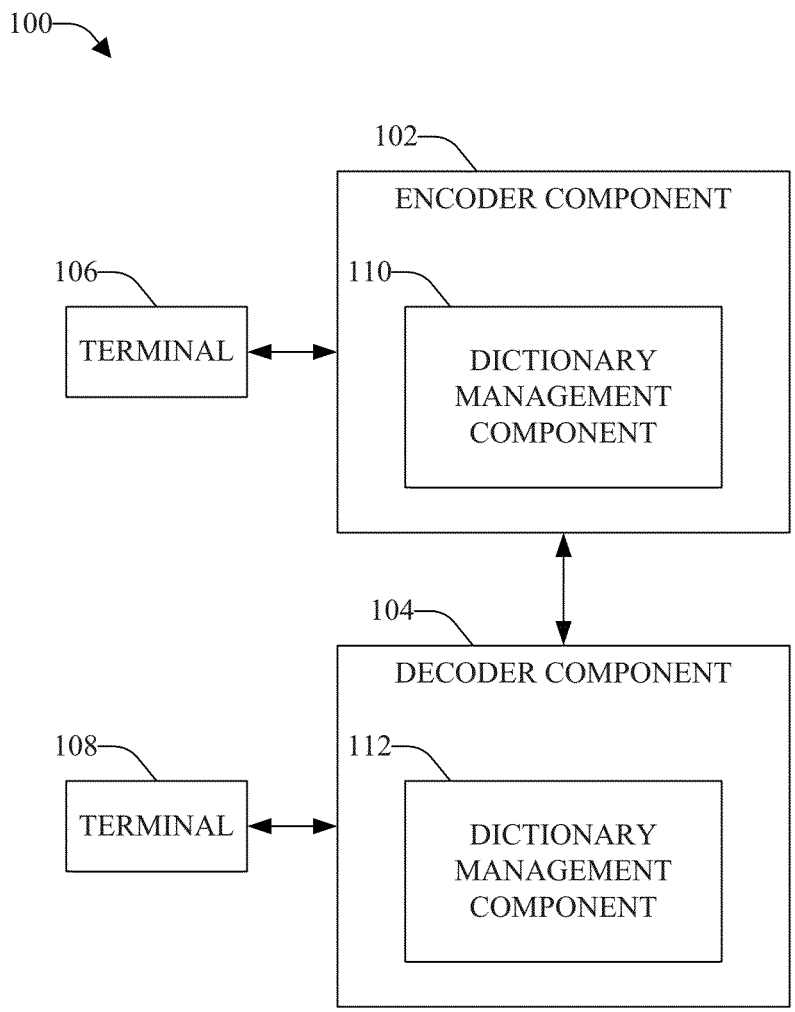
FIG. 1 illustrates a block diagram of an example system that can generate and maintain synchronized dictionaries for use in applying sparse coding to facilitate encoding and decoding video content in accordance with various aspects and implementations described herein.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

The amount of data representing media information can be extremely large. Further, transmitting digital video information over communication networks can consume large amounts of bandwidth. The cost of transmitting data from one location to another can be a function of number of bits transmitted per second. Typically, higher bit transfer rates are associated with increased cost. Higher bit rates also can progressively add to required storage capacities of memory systems, which can thereby increase storage cost. Thus, at a given quality level, it can be much more cost effective to use fewer bits, as opposed to more bits, to store digital images and videos. It therefore can be desirable to compress media data for recording, transmitting, or storing.

An encoder is a device capable of encoding (e.g., coding) (and sometimes decoding) digital media data. A decoder is a device capable of decoding digital media data. Encoding digital media data can involve compressing the digital media data, and decoding of encoded digital media data can involve decompressing the encoded digital media data. A codec is a device capable of coding and/or decoding digital media data.

Sparse coding is a coding technique that can potentially improve video compression coding efficiency. In sparse coding, there can be a dictionary of elements, which can be based, for example, on reference video frames of a video session. The dictionary elements can be used to facilitate coding (e.g., sparse coding) of video content. Generally, the less accurate a dictionary is in representing the video content to be coded, the more diminished the value of sparse coding may be in compressing the video content. Conventional dictionaries trained from generic images or video frames can be less optimal or less accurate with regard to representing video content to be coded, may not be able to cover a wide variety of video compression scenarios, and can be inefficient in compressing video content.

To that end, techniques for generating synchronized dictionaries for sparse coding to facilitate coding (e.g., encoding or decoding) of video content (e.g., in relation to video sessions) are presented. An encoder component (e.g., as part of a codec) can contain a built-in dictionary that can be used for sparse coding (e.g., encoding) of video content. A decoder component (e.g., as part of another codec) can have a corresponding built-in dictionary that can be used for sparse coding (e.g., decoding) of video content. A built-in dictionary can be the base dictionary that the encoder component or decoder component can use for coding video content. The encoder component and decoder component also can generate one or more new dictionaries (e.g., custom sparse coding dictionaries) based at least in part on information (e.g., reference video frames) obtained by the encoder component and decoder component during video sessions (e.g., video conferencing session associated with the encoder component and decoder component).

In some implementations, the encoder component can be associated with (e.g., contained within or communicatively connected to) a first terminal, and the decoder component can be associated with a second terminal. The first terminal can be associated with a first terminal address (e.g., Media Access Control (MAC) address), and the second terminal can be associated with a second terminal address. As more fully disclosed herein, the encoder component and decoder component can generate unique IDs, which can be based at least in part on the respective terminal addresses, that can be assigned to dictionaries to facilitate identifying dictionaries that are common to the first terminal (and associated encoder component) and the second terminal (and associated decoder component). At desired times, the first terminal and second terminal can be communicatively connected to each other (e.g., during a video session) to communicate information (e.g., video, audio) between the first terminal and second terminal.

The encoder and decoder components each can include respective dictionary management components that can control generation (or identification or determination) and use of dictionaries (e.g., coding dictionaries) for coding (e.g., sparse coding) of video content. For example, a dictionary management component can dynamically generate a new dictionary or modify an existing dictionary based at least in part on information (e.g., reference video frames) associated with a video session and defined coding criterion. During a video session, the encoder component, which can be associated with a terminal at one end of the video session, can generate and maintain a dictionary that can be synchronized with a corresponding (e.g., common) dictionary maintained by a decoder component associated with the terminal at the other end of the video session. During the current video session or a subsequent video session associated with the encoder component and decoder component, the encoder component and decoder components can identify and use the common dictionaries to facilitate coding video content based at least in part on sparse coding.

The dictionary management components of the encoder and decoder components can assign respective unique identifiers (IDs) to respective dictionaries to facilitate synchronizing or identifying common dictionaries for use during coding of video content of a video session so that the encoder component and decoder component are using corresponding dictionaries. In some implementations, the respective dictionary management components can use a multi-tier structure for generating unique IDs. For example, the dictionary management components can structure a unique ID to include a first tier that can contain the respective addresses of the respective terminals, and a second tier that can include a dictionary sub-ID field, which can contain a dictionary sub-ID having a desired number of bits (e.g., 16 bits, or less or more than 16 bits). The dictionary management components can use the first tier to identify dictionaries that are common between the two terminals associated with the video session, and the second tier to distinguish between different common dictionaries associated with the two terminals.

During a video session, employing their respective dictionary management components, the encoder component and decoder component can signal each other and exchange information, including respective unique IDs associated with respective dictionaries, to identify common dictionaries between the encoder component and decoder component. A dictionary of the encoder component and a dictionary of the decoder component can be common dictionaries when, for example, the dictionary of the encoder component and the dictionary of the decoder component are identical or correspond to each other (e.g., they contain identical or corresponding dictionary elements). The respective dictionary management components of encoder component and decoder component can each identify and select a subset of common dictionaries for use in coding (e.g., based on sparse coding) video content associated with the video session. The encoder component can encode the video content using a common dictionary(ies) maintained at the encoder component, and can transmit the encoded video content to the decoder component at the other end of the video session. The decoder component can use its corresponding common dictionary(ies) to decode the encoded video content and reconstruct the video content for presentation to a viewer via the terminal associated with the decoder component.

During a video session, the dictionary management component of the decoder component can identify (e.g., dynamically or automatically) and select video frames from the video session that can be used as reference video frames to generate new dictionary elements that can be included in a new or existing common dictionary, based at least in part on the defined coding criterion. The defined coding criterion can relate to, for example, the quality of the visual image in a video frame or the amount of change in the scene depicted in the video frame, etc. The dictionary management component of the decoder component can identify information in or extract information from the reference video frames to generate new dictionary elements that can be added to the corresponding common dictionary or a new common dictionary (e.g., relating to the terminals associated with the video session). In some implementations, the dictionary management component can apply a training algorithm that can facilitate generating dictionary elements based at least in part on a reference video frame(s).

The dictionary management component of the decoder component also can communicate information, such as a frame ID (e.g., picture ID), to the encoder component to enable the dictionary management component of the encoder component to identify and select corresponding video frames at the encoder component side. In some implementations, the decoder component and encoder component can establish a secured communication channel between each other and can use the secured communication channel to communicate one or more messages that can contain information, such as information (e.g., frame IDs) relating to the reference video frames, to each other. This can enable the decoder component to know whether the encoder component received the message regarding the reference video frames so that the encoder component and decoder component can build corresponding dictionary elements and/or corresponding common dictionaries based on corresponding reference video frames respectively identified by respective dictionary management components on each side of the video session.

The dictionary management component of the encoder component can receive the message(s), and can identify and select the corresponding video frames to be reference video frames, based at least in part on the received frame IDs. The dictionary management component of the encoder component can generate new dictionary elements, based at least in part on information identified in or extracted from the reference video frames, and can add the new dictionary elements to the corresponding common dictionary or a new common dictionary (e.g., relating to the terminals associated with the video session). In some implementations, the dictionary management component can apply a training algorithm that can facilitate generating dictionary elements based at least in part on a reference video frame(s).

The dictionary management components of the encoder component and decoder component can dynamically generate new dictionary elements or new dictionaries in real time while still online during the video session, or can generate the new dictionary elements or new dictionaries when offline after the video session is completed. The dictionary management components of the encoder component and decoder component can store information relating to the reference video frames (e.g., reference video frames, frame IDs, etc.) in respective data stores for processing at a desired time (e.g., while online or offline).

In some implementations, a first codec can include a first encoder component and first decoder component, and a second codec can include a second encoder component and second decoder component. The first codec and second codec can be respectively associated with terminals at respective ends (e.g., first end, second end) of a video session. The first encoder component (e.g., sender of encoded video content) and second decoder component (e.g., receiver of encoded video content) can build a first set of common dictionaries, which can include a first set of common dictionary elements. The second encoder component (e.g., sender of other encoded video content) and first decoder component (e.g., receiver of other encoded video content) can build a second set of common dictionaries, which can include a second set of common dictionary elements. The first set of common dictionaries can be different from the second set of common dictionaries.

To enable the first codec and the second codec to distinguish between the different common dictionaries of the first set and second set, the first codec and second codec can assign respective unique IDs to each of the dictionaries. The first codec and second codec each can structure the unique IDs for the first set of common dictionaries and the second set of common dictionaries, based at least in part on the order of the respective terminal addresses within the first tier of the unique IDs, to facilitate identifying which common dictionaries belong to the first set and which common dictionaries belong to the second set.

For example, the first tier of a unique ID can include two multi-bit sub-address fields having a desired number of bits (e.g., 48 bits for each sub-address field, or more or less than 48 bits for each sub-address field). The first and second codecs each can tag the first encoder component (associated with a first terminal) and second decoder component (associated with the second terminal) with two multi-bit sub-address fields in the unique ID applicable to the first encoder component and second decoder component. The most significant sub-address field can contain the terminal address of the first terminal and the next sub-address field (e.g., next set of significant bits) can contain the terminal address of the second terminal.

Also, the first and second codecs each can tag the second encoder component (associated with a second terminal) and first decoder component (associated with the first terminal) with two multi-bit sub-address fields in the unique ID applicable to the second encoder component and first decoder component. In relation to the second encoder and first decoder components, the most significant sub-address field can contain the terminal address of the second terminal and the next sub-address field can contain the terminal address of the first terminal.

Each of the unique IDs also can contain a second tier, which can have a desired number of bits and can contain a dictionary sub-ID to facilitate distinguishing between different common dictionaries of a set (e.g., first set or second set). The first and second codecs can each assign respective dictionary sub-ID values to a dictionary sub-ID field. In some implementations, dictionary management components of the first codec and second codec can synchronize common dictionaries between the first end and second end of the video session through, for example, back-channel messages.

Referring now to the drawings, FIG. 1 illustrates a block diagram of an example system 100 that can generate and maintain synchronized dictionaries for use in applying sparse coding to facilitate encoding and decoding video content in accordance with various aspects and implementations described herein. The system 100 can be used to compress video content, for example, associated with a video conferencing application or system, or other video applications or systems that may be associated with a significant amount of repetitive image features in visual images.

The system 100 can utilize characteristics associated with certain video applications or systems, such as video conferencing applications or systems, to facilitate efficiently encoding and decoding video content. For example, video conferencing often can involve visual images or portions of visual images that are relatively highly repetitive in nature. For instance, a same or similar room, background, and/or camera angle, etc., often can be used during video sessions between two terminals and/or associated entities (e.g., users). When the room, background, camera angle, etc. is the same or similar, there typically is a relatively smaller amount of new information (e.g., visual information) in the visual images. The system 100 can build and maintain dictionaries (e.g., sparse coding dictionaries) based at least in part on information from a previous video session or an earlier portion of a current video session, and can effectively use the dictionaries to improve coding efficiency for video content being communicated using the system 100.

The system 100 can include an encoder component 102 that encodes received or captured digital media data (e.g., digital video content, audio content, multimedia content, etc.) to produce encoded digital media data as an output. The encoder component 102 can encode or compress the digital media data in accordance with a defined compression or encoding algorithm(s). The encoder component 102 can be a stand-alone unit, part of a codec, part of another component or unit, or can have portions of the encoder component 102 distributed in multiple components or units of the system 100.

The system 100 also can include a decoder component 104 that decodes received encoded digital media data (e.g., digital video content, audio content, multimedia content, etc.) to produce decoded or reconstructed digital media data as an output (e.g., for presentation on a display screen). The decoder component 104 can decode or decompress the encoded digital media data in accordance with a defined decompression or decoding algorithm(s), which can correspond to the algorithm(s) used to encode the digital media data. The decoder component 104 can be a stand-alone unit, part of a codec, part of another component or unit, or can have portions of the decoder component 104 distributed in multiple components or units of the system 100.

Figure 3:
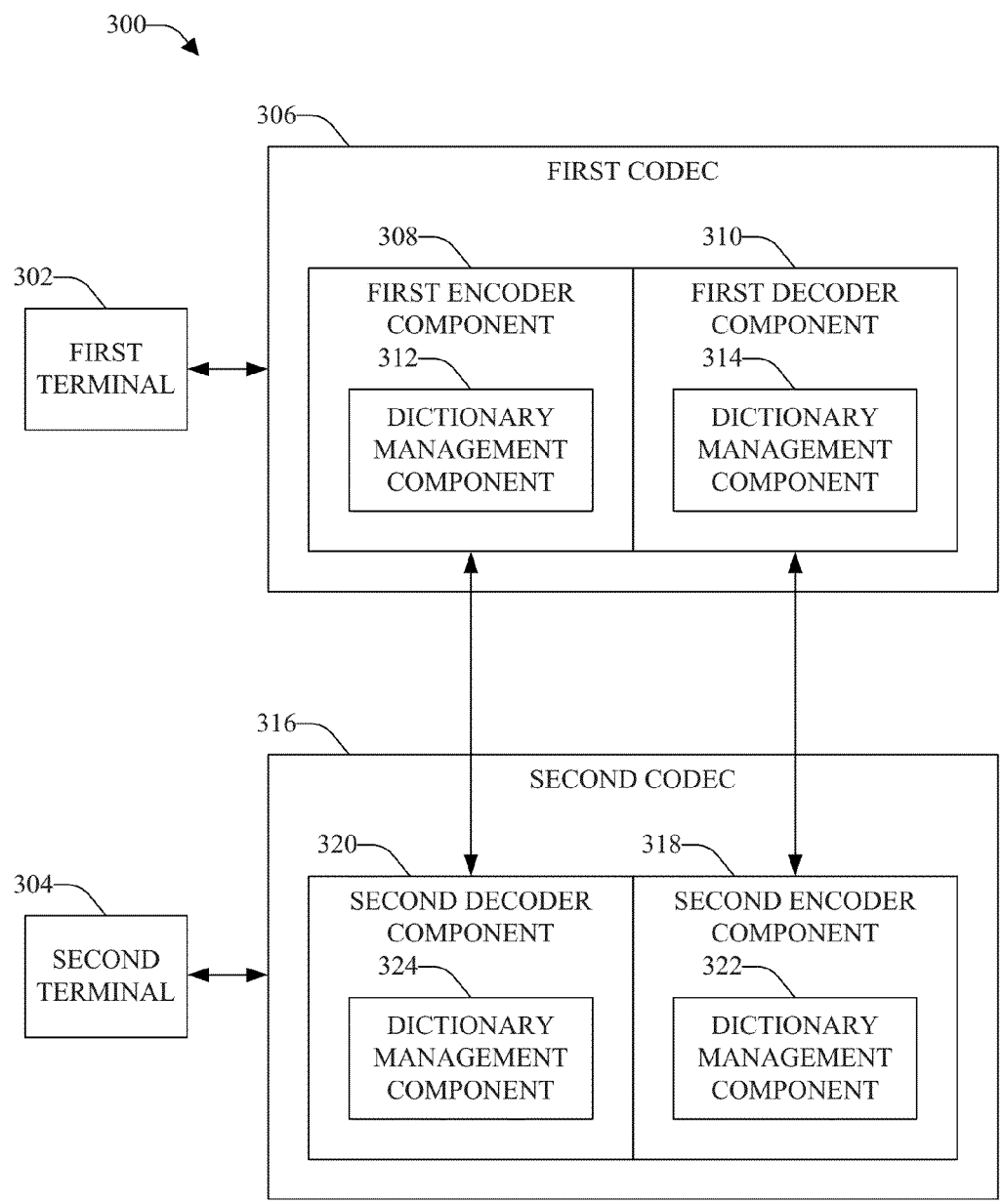
FIG. 3 depicts a block diagram of an example system that can employ codecs that can generate and maintain synchronized dictionaries for use in applying sparse coding to facilitate encoding and decoding video content in accordance with various aspects and implementations.

In some implementations (e.g., as depicted in FIG. 3 and described herein), the encoder component 102 can be part of a codec that also can include a decoder component, which can decode encoded digital media data (e.g., received from the encoder component 102). Also, the decoder component 104 can be part of another codec that can include an encoder component, which can encode digital media data (e.g., for transmission to the decoder component associated with the codec that also includes the encoder component 102).

The encoder component 102 can be associated with a terminal 106 that can be used to receive or provide (e.g., display, transmit) information. The decoder component 104 can be associated with a terminal 108 that can be used to receive or provide (e.g., display, transmit) information. A terminal (e.g., 106, 108) can capture information (e.g., video or audio information), or can be associated with one or more components (e.g., capture devices, such as a camera; not shown in FIG. 1) that can capture information and provide the information to the terminal (e.g., for communication to another terminal), for example, during a video session. A terminal (e.g., 106, 108) can include, for example, a computer, a phone (e.g., a mobile phone and/or smart phone), a tablet, an electronic gaming device, an application-specific computing device (e.g., communication device specifically for video conferencing), an Internet Protocol Television (IPTV), or a combination of communication devices and/or peripheral devices.

In accordance with exemplary implementations, the encoder component 102 can include a dictionary management component 110 and the decoder component 104 can include a dictionary management component 112. The dictionary management component 110 and dictionary management component 112 can respectively generate, maintain, and/or modify one or more synchronized common dictionaries (e.g., common sparse coding dictionaries) for use in applying sparse coding to encode and decode video content. In some implementations, the encoder component 102 and/or decoder component 104 each can have a built-in or defined dictionary that can be used for coding content. In accordance with various implementations, the dictionary management component 110 and/or dictionary management component 112 can use a built-in or defined dictionary, can modify the built-in or defined dictionary, can generate a new dictionary based at least in part on the built-in or defined dictionary, or can generate a new dictionary that does not rely on the built-in or defined dictionary.

When preparing for a video session (e.g., video conferencing session) between the terminal 106 and the terminal 108, the dictionary management component 110 and dictionary management component 112 can communicate signals between each other to facilitate identifying common dictionaries (e.g., dictionaries in common) between the encoder component 102 and decoder component 104. A dictionary of the encoder component 102 and a dictionary of the decoder component 104 can be common dictionaries when, for example, the dictionary of the encoder component 102 and the dictionary of the decoder component 104 are identical or correspond to each other (e.g., they contain identical or corresponding dictionary elements). The dictionary management component 110 and dictionary management component 112 each can generate and assign respective unique identifiers (e.g., universally unique identifiers) to respective dictionaries.

Figure 2:
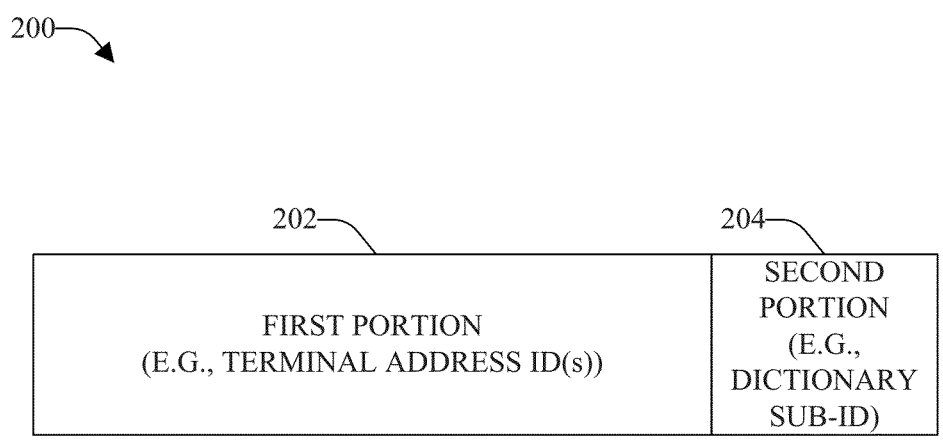
FIG. 2 depicts a diagram of an example unique identifier that can be assigned to a dictionary (e.g., sparse coding dictionary) to uniquely identify that dictionary from other dictionaries, in accordance with various aspects and implementations.

Referring briefly to FIG. 2 (along with FIG. 1), FIG. 2 depicts a diagram of an example unique identifier (ID) 200 that can be assigned to a dictionary (e.g., sparse coding dictionary) to uniquely identify that dictionary from other dictionaries, in accordance with various aspects and implementations. In some implementations, a unique ID 200 of a dictionary can include a first portion 202 (e.g., first tier, first field, first subset of bits for identification) that can contain an address (e.g., Media Access Control (MAC) address) or ID (e.g., terminal ID) associated with a terminal(s) (e.g., 106 or 108) that is associated with the encoder component 102 that is encoding the content and/or associated with the decoder component 104 that is decoding the content. The address or ID associated with a terminal (e.g., 106, 108) can have a desired number of bits (e.g., 48 bits, or more or less than 48 bits, e.g., for each of the terminals with which the address or ID is associated). The unique ID 200 also can include a second portion 204 (e.g., second tier, second field, second subset of bits for identification) that can be a dictionary sub-ID that can be used to identify the dictionary from other dictionaries associated with the terminal and/or to distinguish between dictionaries common to the terminal 106 and the terminal 108. The sub-ID associated with a dictionary can have a desired number of bits (e.g., 16 bits, or more or less than 16 bits).

Before or during a video session, and/or when making calls (e.g., when making bi-directional calls using codecs, as shown in FIG. 3), between the terminal 106 and the terminal 108, the dictionary management component 110 and the dictionary management component 112 can exchange information to facilitate establishing the video session. The dictionary management component 110 and the dictionary management component 112 can exchange, for example, unique IDs with each other. The unique IDs provided by the dictionary management component 110 to the dictionary management component 112 can indicate the dictionaries of the encoder component 102 to the dictionary management component 112. The unique IDs provided by the dictionary management component 112 to the dictionary management component 110 can indicate the dictionaries of the decoder component 104 to the dictionary management component 110. The dictionary management component 110 can identify one or more dictionaries associated with the decoder component 104 that are common to the encoder component 102, based at least in part on the respective unique IDs of the respective dictionaries. The dictionary management component 112 also can identify one or more dictionaries associated with the encoder component 102 that are common to the decoder component 104, based at least in part on the respective unique IDs of the respective dictionaries. By respectively identifying common dictionaries, the dictionary management component 110 and the dictionary management component 112 can synchronize with each other to identify a subset of dictionaries common to both the encoder component 102 and the decoder component 104. The dictionary management component 110 and the dictionary management component 112 can respectively control operations of the encoder component 102 and the decoder component 104 to use one or more of the common dictionaries for coding of video content during a video session between the terminal 106 and the terminal 108.

During or after a video session, the dictionary management component 110 and the dictionary management component 112 can generate (e.g., dynamically or automatically) new dictionaries or modify (e.g., dynamically or automatically) existing dictionaries (e.g., dictionary on the side of the encoder component 102 and a corresponding or common dictionary on the side of the decoder component 104). The dictionary management component 110 can use a defined coding-related algorithm(s), such as a sparse coding dictionary generation algorithm(s), that can be used to generate or modify a dictionary and/or elements or other information associated with a dictionary of the encoder component 102. The dictionary management component 112 can use a corresponding defined coding-related algorithm(s) (e.g., a decoder-side sparse coding dictionary generation algorithm(s)) that can be used to generate or modify a dictionary and/or dictionary elements or other information associated with a dictionary of the decoder component 104. The algorithm(s) on the side of the decoder component 104 can correspond with the algorithm(s) on the side of the encoder component 102.

In some implementations, during a video session between the terminal 106 and the terminal 108, the dictionary management component 112, using the defined coding-related algorithm(s), can select (e.g., dynamically or automatically) one or more video frames that can be candidates to be used as reference video frames to build a new dictionary or modify an existing dictionary that can be common to the encoder component 102 and the decoder component 104. A reference video frame and/or information associated therewith can be a new element(s) that the dictionary management component 112 can add to the new or existing common dictionary on the decoder-component side.

The dictionary management component 112 can select a video frame to be a reference video frame based at least in part on one or more defined coding criterion. The coding criterion can relate to, for example, the quality of the video information associated with the video frame, scene change detection (e.g., whether the scene in the video frame is changing or is relatively static), etc. When the dictionary management component 112 selects a video frame from the video session as a reference video frame for use in generating new dictionary elements that can be included in a new or existing common dictionary, the dictionary management component 112 can identify a frame ID (e.g., picture ID) associated with the reference video frame. As more fully disclosed herein, the frame ID associated with the reference video frame can facilitate enabling the encoder component 102 and decoder component 104 to generate the same dictionary elements that can be included in new or existing common dictionaries (e.g., dictionaries that the encoder component 102 and decoder component 104 have in common with each other).

The dictionary management component 112 can transmit a message, which can include the frame ID associated with the reference video frame, to the dictionary management component 110 of the encoder component 102. In some implementations, the encoder component 102 and the decoder component 104 can establish a secure communication channel between each other, and the message can be communicated from the decoder component 104 to the encoder component 102 via the secure communication channel. The secure communication channel can enable the decoder-component side dictionary management component 112 to detect whether the message has been received by the encoder component 102 so that the dictionary management component 112 can know whether the encoder-component side dictionary management component 110 received the message. In other implementations, the message can be sent to the encoder component 102 via another desired communication channel established between the encoder component 102 and the decoder component 104. As desired, to facilitate determining whether the message was received by the encoder-component side dictionary management component 110, the encoder-component side dictionary management component 110 can generate and transmit a confirmation message via the secure communication channel or the other communication channel. In some implementations, when the dictionary management component 110 and the dictionary management component 112 use the secure communication channel, a confirmation message may not be employed. Knowing whether the dictionary management component 110 received the message can enable the dictionary management component 112 and the dictionary management component 110 to maintain synchronization of their common dictionaries, to generate new or modify existing common dictionaries, and/or to add corresponding elements to their common dictionaries, based at least in part on corresponding reference frames.

The dictionary management component 110 can receive the frame ID. Using a defined coding algorithm(s) that can correspond to the defined coding algorithm(s) used on the decoder-component side, the dictionary management component 110 can identify, and select as a candidate reference video frame, the video frame (e.g., same or corresponding video frame) on the encoder-component side that corresponds to the reference video frame, based at least in part on the frame ID. The dictionary management component 110 can add information relating to the corresponding video frame to an existing common dictionary or can create a new common dictionary.

The dictionary management component 110 and the dictionary management component 112 can respectively generate, maintain, or modify dictionaries during a video session (e.g., in real time (e.g., "on the fly")) or offline after the video session is completed. The dictionary management component 110 and the dictionary management component 112 respectively can store information (e.g., frame IDs, information relating to reference video frames, parameter values, etc.) for generating, maintaining, or modifying dictionaries associated with a video session in a data store for further processing (e.g., offline processing) at a desired time (e.g., when the video session is completed).

As disclosed, the dictionary management component 110 and the dictionary management component 112 can update or generate (e.g., dynamically) new common dictionaries or new dictionary elements during a video session between the terminal 106 and the terminal 108. There may be times when one of the dictionary management components (e.g., 112) completes an update on a common dictionary, generates a new dictionary, or generates a new dictionary element(s) before the other dictionary management component (e.g., 110) has done so. It can be desirable to use an updated or new common dictionary or new dictionary elements during the session, while also ensuring that the encoder component 102 and decoder component 104 are using corresponding (e.g., identical) common dictionaries during the video session.

In some implementations, to facilitate maintaining dictionary synchronization, at desired times during the video session, the dictionary management components (e.g., 110, 112) can re-synchronize to identify common dictionaries before using new dictionary elements, updated common dictionaries, or new common dictionaries generated during the video session. The dictionary management component 110 and the dictionary management component 112 can communicate messages (e.g., synchronizing messages) to each other to let one dictionary management component know when the other dictionary management component has generated new dictionary elements, modified a common dictionary, or generated a new dictionary (e.g., for use as a common dictionary).

In some implementations, for newly generated dictionaries (e.g., completely new or based on a pre-existing common dictionary), at desired times during the video session, the dictionary management components (e.g., 110, 112) can re-synchronize to identify common dictionaries, based at least in part on unique IDs associated with the newly generated common dictionaries. This can be performed in a similar manner as was performed at the beginning of the video session.

In other implementations, with regard to updated versions of pre-existing common dictionaries, at desired times during the video session, the dictionary management components (e.g., 110, 112) can re-synchronize to identify common dictionaries, including updated versions of common dictionaries, based at least in part on unique IDs and/or unique dictionary-version IDs associated with the common dictionaries. The dictionary management components can generate and use unique dictionary-version IDs, in accordance with the defined coding algorithm(s), to distinguish between different versions of updated common dictionaries.

In still other implementations, regarding newly generated dictionary elements for common dictionaries, at desired times during the video session, the dictionary management components (e.g., 110, 112) can communicate messages to each other to re-synchronize to identify the newly generated dictionary elements based at least in part on unique dictionary-element IDs associated with the newly generated dictionary elements. For example, the unique dictionary-element IDs can be based at least in part on a frame ID associated with the reference video frame from which the dictionary element(s) is derived, in accordance with the defined coding algorithm(s). The dictionary generation components (e.g., 110, 112) can perform re-synchronization relating to common dictionaries, for example, at periodic times during the session or dynamically in response to an event (e.g., when an update to a common dictionary is completed). As a result, the dictionary management component 110 and the dictionary management component 112 can maintain synchronization of common dictionaries, including updated common dictionaries, and can use a new common dictionary element(s) as such element(s) is generated during the video session.

FIG. 3 illustrates a block diagram of example system 300 that can employ codecs that can generate and maintain synchronized dictionaries for use in applying sparse coding to facilitate encoding and decoding video content in accordance with various aspects and implementations. The system 300 can comprise a first terminal 302 and a second terminal 304 that can be communicatively connected to each other at desired times (e.g., during a video session). The connection can be a wireline or a wireless connection. The first terminal 302 and the second terminal 304 can communicate video content to each other. In some implementations, the video content can be part of a video conferencing session involving a first subset of users perceiving (e.g., viewing) video content received from the second terminal 304 via the first terminal 302, and a second subset of users perceiving video content received from the first terminal 302 via the second terminal 304.

The first terminal 302 can include or be associated with a first codec 306 that can include a first encoder component 308 and first decoder component 310. The first encoder component 308 can contain a dictionary management component 312, and the first decoder component 310 can contain a dictionary management component 314. The second terminal 304 can include or be associated with a second codec 316 that can include a second encoder component 318 and second decoder component 320. The second encoder component 318 can include a dictionary management component 322, and the second decoder component 320 can contain a dictionary management component 324.

Respective encoder components (e.g., 308, 318) can be the same as or similar to, and/or can include the same or similar features as, any of the encoder components as more fully described herein. Respective decoder components (e.g., 310, 320) can be the same as or similar to, and/or can include the same or similar features as, any of the decoder components as more fully described herein. Respective dictionary management components (e.g., 312, 322) associated with respective encoder components can be the same as or similar to, and/or can include the same or similar features as, any of the dictionary management components associated with encoder components as more fully described herein. Respective dictionary management components (e.g., 314, 324) associated with respective decoder components can be the same as or similar to, and/or can include the same or similar features as, any of the dictionary management components associated with decoder components as more fully described herein.

The first encoder component 308 (e.g., near end sender) associated with the first codec 306 and the second decoder component 320 (e.g., far end receiver) associated with the second codec 316 can generate and maintain a set of common dictionaries and/or common dictionary elements. The second encoder component 318 (e.g., far end sender) associated with the second codec 316 and the first decoder component 310 (e.g., near end receiver) associated with the first codec 306 can generate and maintain another set of common dictionaries and/or common dictionary elements.

The respective dictionary management components (e.g., 312, 314, 322, 324) each can identify and differentiate between different dictionaries and dictionary elements based at least in part on respective unique IDs associated with respective dictionaries or dictionary elements. In some implementations, the respective dictionary management components (e.g., 312, 314, 322, 324) each can identify and differentiate between different dictionaries and dictionary elements based at least in part on the order of the MAC or terminal addresses of the respective terminals (e.g., 302, 304) in the unique IDs associated with respective dictionaries or dictionary elements.

For example, the dictionary management components (e.g., 312, 324) each can tag or identify the first encoder component 308 and second decoder component 320 using two fields relating to the MAC or terminal addresses in the unique IDs of the dictionaries and/or dictionary elements associated with the first encoder component 308 and second decoder component 320. The dictionary management components (e.g., 312, 324) can structure the unique IDs such that the most significant field (e.g., 48 bits, or more or less than 48 bits) can contain the address of the first terminal 302, and the next field (e.g., 48 bits, or more or less than 48 bits) can contain the address of the second terminal 304. Also, the dictionary management components (e.g., 322, 314) each can tag or identify the second encoder component 318 and first decoder component 310 using (e.g., differently using) two fields relating to the MAC or terminal addresses in the unique IDs of the dictionaries and/or dictionary elements associated with the second encoder component 318 and first decoder component 310. The dictionary management components (e.g., 322, 314) can structure the unique IDs such that the most significant field (e.g., 48 bits, or more or less than 48 bits) can contain the address of the second terminal 304, and the next field (e.g., 48 bits, or more or less than 48 bits) can contain the address of the first terminal 302.

As more fully disclosed herein, a unique ID also can contain another field (e.g., 16 bits, or more or less than 16 bits) that can be used for the dictionary sub-ID. In some implementations, the field for the dictionary sub-ID can be after the most significant field and the next field in the unique ID (e.g., dictionary sub-ID can be in the least significant field of the unique ID). In accordance with various other implementations, the respective addresses (e.g., MAC or terminal addresses) and dictionary sub-ID can be differently ordered in the fields of a unique ID, as desired. For example, a unique ID can include a most significant field of a desired size that can include an address associated with one terminal, a next field of a desired size that can include a dictionary sub-ID, and a least significant field of a desired size that can include an address associated with another terminal.

The address-related tags or IDs of respective unique IDs can enable a dictionary management component (e.g., 312) at one end of a session and a dictionary management component (e.g., 324) at another end of that session to distinguish between respective dictionaries or dictionary elements that are common, and those which are not common, between the respectively related encoder component (e.g., 308) and decoder component (e.g., 320). The dictionary sub-IDs of respective unique IDs can enable a dictionary management component (e.g., 312) at one end of a session and a dictionary management component (e.g., 324) at another end of that session to distinguish between different common dictionaries or common dictionary elements associated with the encoder component (e.g., 308) and decoder component (e.g., 320). In some implementations, an encoder component (e.g., 308) on one side of a session and a decoder component (e.g., 320) on the other side of the session can facilitate synchronizing respective dictionary sub-IDs through messages, including a back-channel message(s).

The system 300 has been described herein to have respective dictionary management components (e.g., 312, 314, 322, 324) for the first encoder component 308, first decoder component 310, second encoder component 318 and second decoder component 320, respectively. In some implementations, the first encoder component 308 and first decoder component 310 can share a same dictionary management component and/or another component(s) (e.g., processor component, data store, analyzer component, etc.) associated therewith. In certain implementations, the second encoder component 318 and second decoder component 320 can share a same dictionary management component and/or another component(s) (e.g., processor component, data store, analyzer component, etc.) associated therewith.

Figure 4:
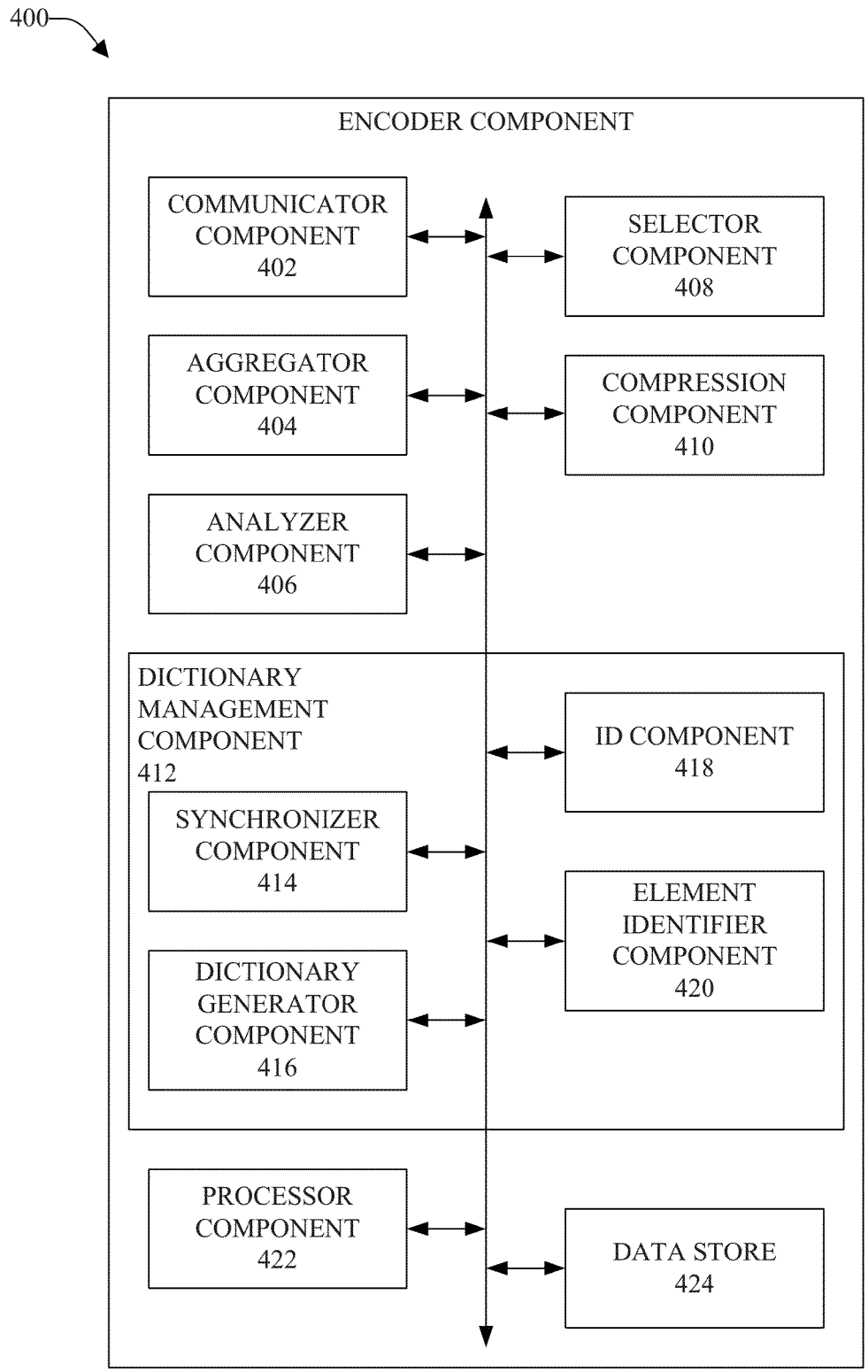
FIG. 4 illustrates a block diagram of an example encoder component in accordance with various aspects and implementations of this disclosure.

FIG. 4 illustrates a block diagram of an example encoder component 400 in accordance with various aspects and implementations of this disclosure. The encoder component 400 can be associated with a terminal that, at desired times, can be communicatively connected to another terminal to facilitate communication of video content between the terminals. The other terminal can include a decoder component that can decode encoded video content received from the encoder component 400 to facilitate display of the video content at the decoder end. In some implementations, the encoder component 400 can be part of a codec. The encoder component 400 can include a communicator component 402, an aggregator component 404, an analyzer component 406, a selector component 408, and compression component 410.

The communicator component 402 can be used to communicate (e.g., transmit, receive) information between the encoder component 400 and other components (e.g., decoder component(s), user interface(s), media source(s), media capture device(s), data store(s), etc.). The information can include, for example, video frames associated with a video session, information that can facilitate encoding data associated with video frames, information relating to defined coding criterion or corresponding rules, information relating to encoding parameters, encoding algorithms (e.g., based on sparse coding), etc. The encoder component 400 can use the information to facilitate encoding data (e.g., video frames). The communicator component 402 also can transmit encoded video frames (e.g., encoded video bitstream) to, for example, a decoder component or data store associated with the video session. In some implementations, the communicator component 402 can establish a secured communication channel, as more fully disclosed herein, to communicate information, such as messages relating to coding, dictionaries, reference video frames, etc., between the encoder component 400 and a decoder component in relation to a video session.

The aggregator component 404 can aggregate data received (e.g., obtained) from various entities (e.g., decoder component(s), media source(s), media capture device(s), processor(s), data store(s), compression component(s), dictionary management component(s), user interface(s), etc.). The aggregator component 404 can correlate respective items of data based at least in part on type of data, source of the data, time or date the data was generated or received, encoding state of the data, a video frame or coding unit to which the data relates, etc., to facilitate analyzing of the data by the analyzer component 406.

The analyzer component 406 can analyze data to facilitate encoding data, generating or modifying dictionaries or dictionary elements, identifying common dictionaries, selecting reference video frames for use in generating dictionary elements, etc., and can generate analysis results, based at least in part on the data analysis. For example, the analyzer component 406 can analyze information relating to dictionaries of the encoder component 400 and dictionaries of a decoder component at another end of a video session to facilitate identifying common dictionaries between the encoder component 400 and that decoder component, in accordance with defined coding criterion, as more fully described herein.

The analyzer component 406 can provide analysis results relating to the dictionaries of the encoder component 400 and the dictionaries of the decoder component at the other end to the dictionary management component 412. The dictionary management component 412 can identify dictionaries in common (e.g., common dictionaries) between the encoder component 400 and that decoder component, based at least in part on such analysis results.

The analyzer component 406 or an associated component (e.g., dictionary management component 412) also can identify candidate reference video frames that can be used to generate new dictionary elements for inclusion in a new common dictionary and/or an existing common dictionary, based at least in part on analysis results relating to selecting reference video frames, and/or generating or modifying dictionaries or dictionary elements. The encoder component 400 also can use the analysis results to facilitate enabling the compression component 410 to efficiently encode video frames of a video frame sequence (e.g., associated with a video session) using sparse coding and common dictionaries between the encoder component 400 and the decoder component at the other end of the video session.

The selector component 408 can select items of data, an applicable encoding-related algorithm (e.g., sparse coding compression algorithm, algorithm for selection of candidate reference video frames, etc.), encoding-related parameter values, or other information, to facilitate encoding data, etc. For example, the selector component 408 can select one or more parameters, one or more items of data, etc., relevant to an encoding task (e.g., identifying common dictionaries, selecting a reference video frame for use in generating a dictionary element, generating or modifying dictionaries or dictionary elements, etc.) being performed by the encoder component 400.

The encoder component 400 also can include a compression component 410 that can encode or compress data associated with a video frame in accordance with a defined encoding or compression algorithm. In some implementations, the compression component 410 can use a sparse coding algorithm in relation to using common dictionaries to encode data. During a video session associated with the encoder component 400 at one end of the session and a decoder component at the other end of the session, the compression component 410 can use common dictionaries between the encoder component 400 and the decoder component to encode digital media data associated with the video session for transmission to the decoder component. The compression component 410 also can use traditional compression algorithms in certain desired instances (e.g., when sparse coding is not desired for encoding data).

The encoder component 400 can include the dictionary management component 412. The dictionary management component 412 can efficiently control encoding (e.g., sparse coding) of video content, including using common dictionaries between the encoder component 400 and an associated decoder component (e.g., at another end of a video session) to facilitate such encoding, as more fully disclosed herein. The dictionary management component 412 can include, for example, a synchronizer component 414, a dictionary generator component 416, an ID component 418, and an element identifier component 420.

The synchronizer component 414 can synchronize and/or identify dictionaries and/or dictionary elements that are common between the encoder component 400 and a decoder component that are part of respective ends of a video session. The synchronizer component 414 (e.g., operating in conjunction with the analyzer component 406) can compare information (e.g., unique IDs) relating to dictionaries of the decoder component to information (e.g., unique IDs) relating to dictionaries of the encoder component 400. Based at least in part on the results of this comparison, the synchronizer component 414 can identify one or more dictionaries of the decoder component that correspond to (e.g., are identical to, match, and/or share a commonality with) one or more dictionaries of the encoder component 400. The synchronizer component 414 also can synchronize modification (e.g., addition of, elimination of, change to, etc., a dictionary element) of a dictionary, based at least in part on an update message(s) (e.g., synchronization or confirmation messages) relating to modification of a dictionary element to common dictionaries between the encoder component 400 and a decoder component at respective ends of a video session.

The dictionary generator component 416 can generate or modify (e.g., in conjunction with the synchronizer component 414) a dictionary, such as a dictionary of the encoder component 400 that corresponds to (e.g., shares a commonality with) a dictionary of a decoder component that can be at an opposite end of a video session from the encoder component 400. The dictionary generator component 416 can identify or select (e.g., as facilitated by the selector component 408) one or more reference video frames associated with a video session for use in generating new dictionary elements, based at least in part on a unique frame ID associated with each video frame, and frame IDs received from the decoder component associated with the session, as more fully disclosed herein. The dictionary generator component 416 can generate and add one or more new dictionary elements to a new or existing dictionary based at least in part on one or more selected reference video frames of a video session between the terminal on the side of the encoder component 400 and a terminal on the decoder side.

The ID component 418 can generate and/or assign respective unique identifiers to respective dictionaries to facilitate distinguishing between the different dictionaries, and selecting a desired common dictionary for use in a video session. In some implementations, the ID component 418 also can identify one or more video frames of the video session on the encoder side to be selected as a reference video frame(s), based at least in part on a frame ID received from the decoder component at the other end of the session. The dictionary generator component 416 can use the reference video frame(s) to generate a dictionary element(s) for inclusion in a dictionary. The frame ID can be associated with a corresponding video frame selected by the decoder component.

The dictionary generator component 416 can operate in conjunction with the ID component 418 to select the one or more reference video frames associated with a video session for use in generating dictionary elements, based at least in part on one or more frame IDs received from the decoder component associated with the video session, and the respective frame IDs associated with the video frames.

The element identifier component 420 can identify information in and/or extract information from one or more reference video frames associated with a video session to generate one or more dictionary elements that can be added to a new or existing dictionary of the encoder component 400 that can correspond to (e.g., can be a dictionary in common with) a dictionary of a decoder component at the other end of the video session. The element identifier component 420 (e.g., operating in conjunction with the dictionary generator component 416) can use, for example, a training algorithm to generate dictionary elements that can be used to facilitate sparse coding of video content. The dictionary generator component 416 can add the dictionary elements to the dictionary for use in subsequent video communications between the encoder component 400 and the decoder component at the other end of a video session (e.g., current or subsequent video session). The dictionary (e.g., dictionary in common with a corresponding dictionary of the decoder component) can facilitate efficient encoding (e.g., sparse coding) of video content and transmission of the encoded video content between the encoder component 400 and the decoder component on the other side of the video session.

In some implementations, the encoder component 400 also can include a processor component 422 that can operate with the other components (e.g., communicator component 402, aggregator component 404, analyzer component 406, etc.) to facilitate performing the various functions of the encoder component 400. The processor component 422 can employ one or more processors, microprocessors, or controllers that can process data, such as information relating to encoding data, information relating to other operations of the encoder component 400, and/or other information, etc., to facilitate encoding video content and/or performing other operations associated with the encoder component 400, as more fully disclosed herein. The processor component 422 can control or manage data flow between the encoder component 400 and other components (e.g., media source, media capture device, decoder component, data store, computer-readable storage media, etc.) associated with the encoder component 400.

The encoder component 400 also can include a data store 424 that can store data structures (e.g., user data, video content, metadata), instructions, procedures, and/or code structure(s) (e.g., modules, objects, hashes, classes) to facilitate performing or controlling operations associated with the encoder component 400. The data store 424 also can store information (e.g., encoding-related algorithms, dictionaries associated with sparse coding, unique IDs, encoding parameters, coding criterion, etc.) relating to encoding data, and/or information relating to other operations of the encoder component 400, etc., to facilitate encoding video content, and performing or controlling operations, associated with the encoder component 400. The processor component 422 can be coupled (e.g., through a memory bus) to the data store 424 in order to store and retrieve information desired to operate and/or confer functionality, at least in part, to the components (e.g., communicator component 402, aggregator component 404, analyzer component 406, etc.) of the encoder component 400, and/or substantially any other operational aspects of the encoder component 400.

Figure 5:
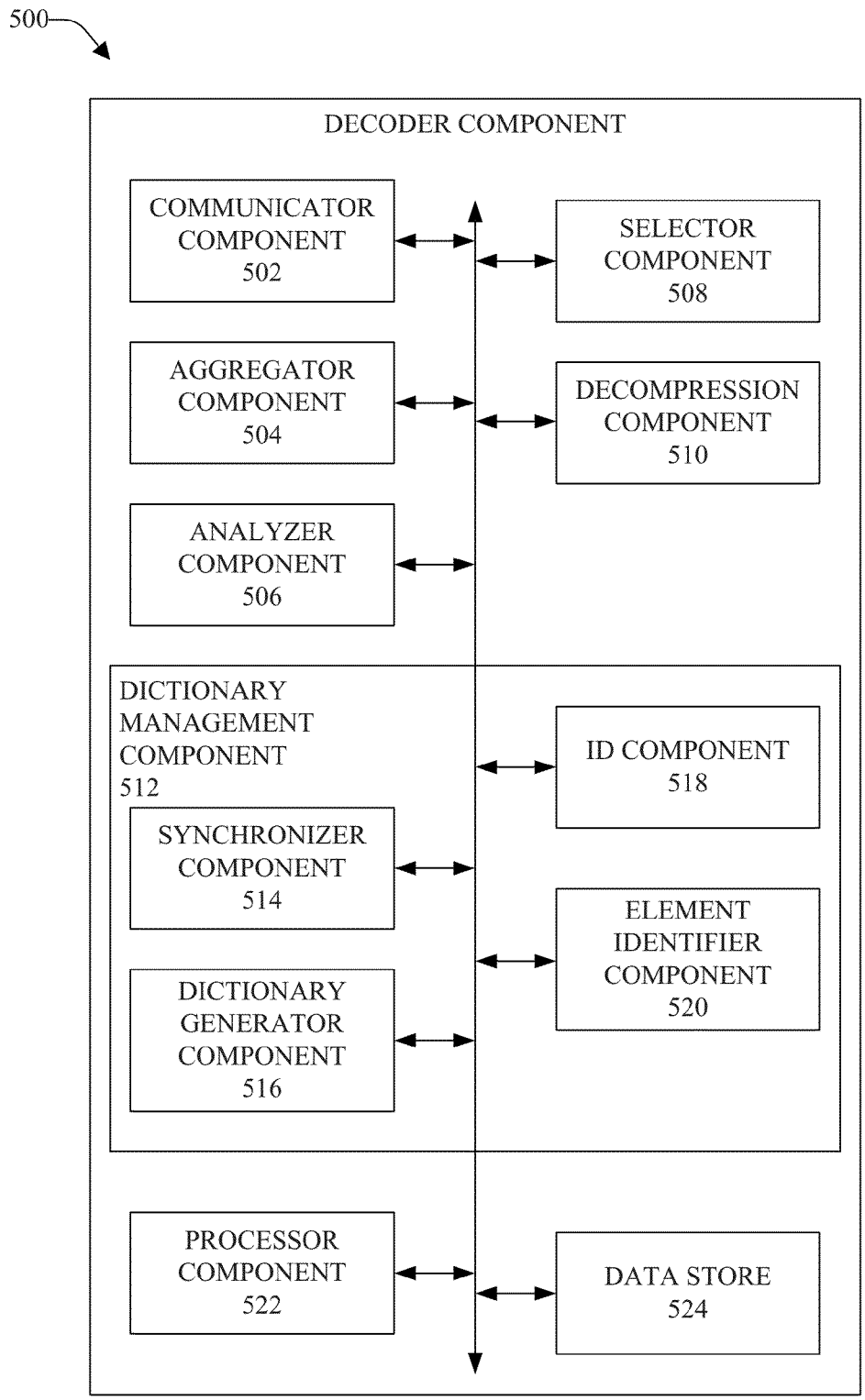
FIG. 5 presents a block diagram of an example decoder component in accordance with various aspects and implementations of this disclosure.

FIG. 5 depicts a block diagram of an example decoder component 500 in accordance with various aspects and implementations of this disclosure. The decoder component 500 can include a communicator component 502, an aggregator component 504, an analyzer component 506, a selector component 508, and a decompression component 510.

The communicator component 502 can communicate (e.g., transmit, receive) information between the decoder component 500 and other components (e.g., encoder component, user interface, data store, etc.). The information can include, for example, video frames associated with a video session, information that can facilitate decoding and reconstructing data associated with video frames, information relating to defined coding criterion or corresponding rules, information relating to decoding parameters, decoding algorithms (e.g., based on sparse decoding), etc. The decoder component 500 can use the information to facilitate enabling the decoder component 500 to decode and reconstruct data. During a video session, the communicator component 502 can receive encoded video frames (e.g., encoded video bitstream) from, for example, an encoder component or data store associated with the video session. In some implementations, the communicator component 502 can establish a secured communication channel, as more fully disclosed herein, to communicate information, such as messages relating to coding, dictionaries, frame IDs associated with selected reference video frames, etc., between the decoder component 500 and an encoder component in relation to a video session.

The aggregator component 504 can aggregate data received (e.g., obtained) from various entities (e.g., encoder component, processor, data store, decompression component, dictionary management component, user interface, etc.). The aggregator component 504 can correlate respective items of data based at least in part on type of data, source of the data, time or date the data was generated or received, decoding state of the data, a video frame or coding unit to which the data relates, etc., to facilitate analyzing of the data by the analyzer component 506.

The analyzer component 506 can analyze data to facilitate decoding data, generating or modifying dictionaries or dictionary elements, identifying common dictionaries, selecting reference video frames for use in generating dictionary elements, etc., and can generate analysis results, based at least in part on the data analysis. For example, the analyzer component 506 can analyze information relating to dictionaries of the decoder component 500 and dictionaries of an encoder component at the other end of the video session to facilitate identifying common dictionaries between the decoder component 500 and that encoder component, in accordance with defined coding criterion, as more fully described herein.

The analyzer component 506 can provide analysis results relating to the dictionaries of the decoder component 500 and the dictionaries of the encoder component to the dictionary management component 512. The dictionary management component 512 can identify dictionaries in common (e.g., common dictionaries) between the decoder component 500 and the encoder component, based at least in part on such analysis results.

The analyzer component 506 or an associated component (e.g., dictionary management component 512) also can identify candidate reference video frames for use in generating dictionary elements, and/or generate or modify a dictionary, based at least in part on analysis results relating to selecting reference video frames and/or generating or modifying dictionaries or dictionary elements. The decoder component 500 also can use the analysis results to facilitate enabling the decompression component 510 to efficiently decode video frames of a video frame sequence (e.g., associated with a video session) using sparse coding and common dictionaries between the decoder component 500 and the encoder component at the other end of the video session.

The selector component 508 can select items of data, an applicable decoding-related algorithm (e.g., decompression (e.g., sparse coding) algorithm, algorithm for selection of candidate reference video frames, etc.), decoding-related parameter values, or other information, to facilitate decoding data, etc. For example, the selector component 508 can select one or more parameters, one or more items of data, etc., relevant to a decoding task (e.g., identifying common dictionaries, selecting a reference video frame for use in generating a dictionary element, generating or modifying dictionaries or dictionary elements, etc.) being performed by the decoder component 500.

The decoder component 500 can include a decompression component 510 that can decode or decompress data associated with an encoded video frame in accordance with a defined decoding or decompression algorithm. In some implementations, the decompression component 510 can use a sparse coding algorithm in relation to using common dictionaries to decode data. In certain implementations, during a video session associated with the decoder component 500 and the encoder component, the decompression component 510 can use common dictionaries between the decoder component 500 and encoder component to decode encoded video content associated with the video session and reconstruct the video content (e.g. for presentation to a viewer). The decompression component 510 also can use traditional decompression algorithms in some instances (e.g., when sparse coding is not desired for decoding encoded data).

The decoder component 500 can include the dictionary management component 512. The dictionary management component 512 can efficiently control decoding of encoded video content, including using common dictionaries between the decoder component 500 and an associated encoder component (e.g., at the other end of the video session) to facilitate such decoding, as more fully disclosed herein. The dictionary management component 512 can include, for example, a synchronizer component 514, a dictionary generator component 516, an ID component 518, and an element identifier component 520.

The synchronizer component 514 can synchronize and/or identify dictionaries and/or dictionary elements that are common between the decoder component 500 and the encoder component that are part of respective ends of the video session. The synchronizer component 514 (e.g., operating in conjunction with the analyzer component 506) can compare information (e.g., unique IDs) relating to dictionaries of the encoder component to information (e.g., unique IDs) relating to dictionaries of the decoder component 500. Based at least in part on the results of this comparison, the synchronizer component 514 can identify one or more dictionaries of the encoder component that correspond to (e.g., are identical to, match, and/or share a commonality with) to one or more dictionaries of the decoder component 500. The synchronizer component 514 also can synchronize modification (e.g., addition of, elimination of, change to, etc., a dictionary element) of a dictionary, based at least in part on an update message(s) (e.g., synchronization or confirmation messages) relating to modification of a dictionary element to common dictionaries between the decoder component 500 and the encoder component.

The dictionary generator component 516 can generate or modify (e.g., in conjunction with the synchronizer component 514) a dictionary, such as a dictionary of the decoder component 500 that can correspond to (e.g., can share a commonality with) a dictionary of an encoder component, which can be at the opposite end of a video session from the decoder component 500. The dictionary generator component 516 can identify or select (e.g., as facilitated by the selector component 508) one or more reference video frames associated with a video session for use in generating new dictionary elements for inclusion in a desired (e.g., common) dictionary, in accordance with defined coding criterion (e.g., used to determine which video frames to select as reference video frames), as more fully disclosed herein. The dictionary generator component 516 can generate and add one or more new dictionary elements to a new or existing dictionary based at least in part on one or more selected reference video frames of a video session between the terminal on the side of the decoder component 500 and a terminal on the encoder side.

The ID component 518 can generate and/or assign respective unique identifiers to respective dictionaries to facilitate distinguishing between the different dictionaries, and selecting a desired common dictionary for use in a video session. In some implementations, the ID component 518 can generate or identify a frame ID that can be associated with a video frame, such as a video frame selected as a reference video frame, of a video session.

The element identifier component 520 can identify information in and/or extract information from one or more reference video frames associated with a video session to generate one or more dictionary elements that can be added to a new or existing dictionary of the decoder component 500 that can correspond to (e.g., can be a dictionary in common with) a dictionary of the encoder component at the other end of the video session. The element identifier component 520 (e.g., operating in conjunction with the dictionary generator component 516) can use, for example, a training algorithm to generate dictionary elements that can be used to facilitate sparse coding of video content. The dictionary generator component 516 can add the dictionary elements to the dictionary for use in subsequent video communications between the decoder component 500 and the encoder component at the other end of a video session (e.g., current or subsequent video session). The dictionary (e.g., dictionary in common with a corresponding dictionary of the encoder component) can facilitate efficient decoding (e.g., sparse coding) and reconstructing of video content.

In some implementations, the decoder component 500 also can include a processor component 522 that can operate in conjunction with the other components (e.g., communicator component 502, aggregator component 504, analyzer component 506, etc.) to facilitate performing the various functions of the decoder component 500, as more fully disclosed herein. The processor component 522 can employ one or more processors, microprocessors, or controllers that can process data, such as information relating to decoding data, information relating to other operations of the decoder component 500, and/or other information, etc., to facilitate decoding encoded video content and/or performing other operations associated with the decoder component 500, as more fully disclosed herein. The processor component 522 also can control or manage data flow between the decoder component 500 and other components (e.g., encoder component, data store, computer-readable storage media, display component, etc.) associated with the decoder component 500.

The decoder component 500 also can include a data store 524 that can store data structures (e.g., user data, metadata), instructions, procedures, and/or code structure(s) (e.g., modules, objects, hashes, classes) to facilitate performing or controlling operations associated with the decoder component 500. The data store 524 also can store information (e.g., decoding-related algorithms, coding modes, decoding parameters, coding criterion, etc.) relating to decoding data and other information relating to other operations of the decoder component 500, to facilitate decoding video content, and performing or controlling operations, associated with the decoder component 500. The processor component 522 can be coupled (e.g., through a memory bus) to the data store 524 in order to store and retrieve information desired to operate and/or confer functionality, at least in part, to the components (e.g., communicator component 502, aggregator component 504, analyzer component 506, etc.) of the decoder component 500, and/or substantially any other operational aspects of the decoder component 500.

The encoder component 400 and decoder component 500 have been described herein to have respective dictionary management components (e.g., 412, 512), communicator components (e.g., 402, 502), aggregator components (e.g., 404, 504), etc. In some implementations, an encoder component (e.g., 400) and a decoder component (e.g., 500) can be part of a same codec or system, and can share (e.g., be coupled to) the same dictionary management component and/or another component(s) (e.g., communicator component, aggregator component, analyzer component, processor component, data store, etc.).

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

In view of the example systems, components, and devices described above, example methods that can be implemented in accordance with this disclosure can be further appreciated with reference to flowcharts in FIGS. 6-9. For purposes of simplicity of explanation, various methods disclosed herein are presented and described as a series of acts; however, it is to be understood and appreciated that this disclosure is not limited by the order of acts, as some acts may occur in different order and/or concurrently with other acts from that shown and described herein. It is noted that not all illustrated acts may be required to implement a described method in accordance with this disclosure. In addition, for example, one or more methods disclosed herein could alternatively be represented as a series of interrelated states or events, such as in a state diagram. Moreover, interaction diagram(s) or call flow(s) represent several of the example methods disclosed herein in accordance with the described subject matter; particularly in instances when disparate entities, or functional elements, enact disparate portions of one or more of the several methods. Furthermore, two or more of the disclosed example methods can be implemented in combination, to accomplish one or more features or advantages described in this disclosure.

Figure 6:
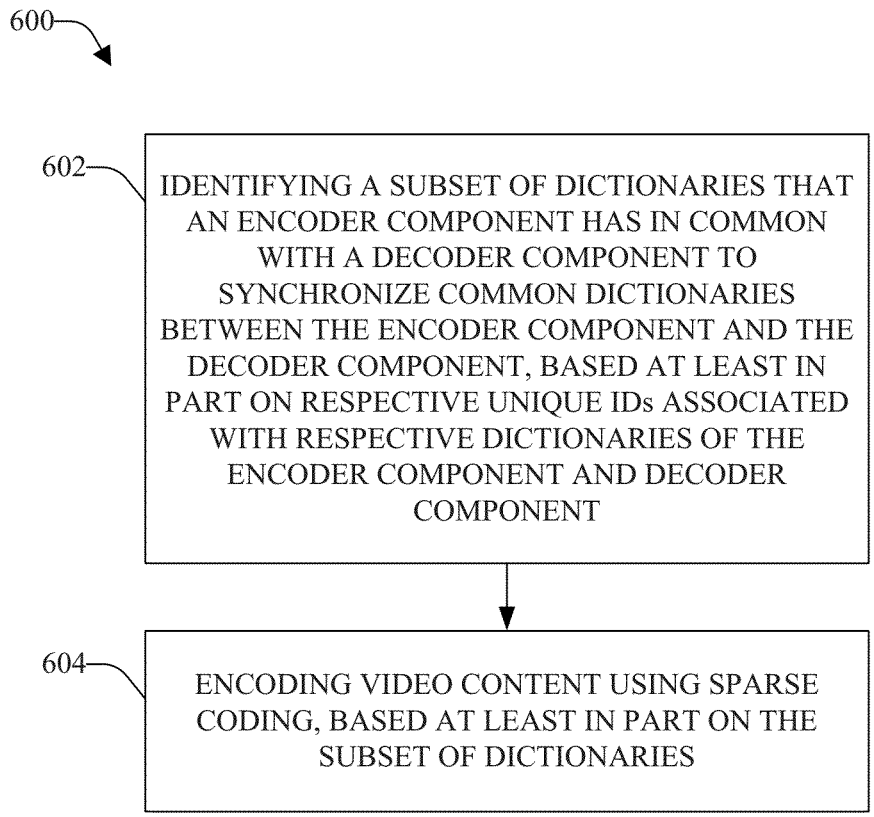
FIG. 6 illustrates a flow chart of an example method for efficiently encoding (e.g., sparse coding) video content using a subset of common dictionaries, in accordance with various aspects and implementations.

With reference first to FIG. 6, illustrated is a flow chart of an example method 600 for efficiently encoding (e.g., sparse coding) video content using a subset of common dictionaries, in accordance with various aspects and implementations. The method 600 can be used, for example, by an encoder component, which can include a dictionary management component.

At 602, a subset of dictionaries, which an encoder component (e.g., associated with a near-end terminal) has in common with a decoder component (e.g., associated with a far-end terminal), can be identified to synchronize common dictionaries between the encoder component and the decoder component, based at least in part on respective unique IDs (e.g., universally unique IDs) associated with respective dictionaries of the encoder component and decoder component. The encoder component and the decoder component can exchange information, including respective unique IDs, relating their respective dictionaries (e.g., coding dictionaries) with each other. A dictionary management component of the encoder component can analyze the received information relating to the dictionaries of the decoder component and can compare such information to information relating to its dictionaries to identify a subset of dictionaries in common between the encoder component and the decoder component. For example, the dictionary management component can compare the respective unique IDs of the respective dictionaries of the encoder and decoder components, and can identify a subset of dictionaries (e.g., dictionary on the encoder end and corresponding dictionary on the decoder end) that have matching unique IDs.

The dictionary management component of the decoder component can similarly analyze the received information relating to the dictionaries of the encoder component and can compare such information to information relating to its dictionaries to identify a subset of dictionaries in common (e.g., identical) between the encoder component and the decoder component. The dictionaries (e.g., common dictionaries) can be structured to be used for sparse coding of video content.

At 604, video content can be encoded using sparse coding, based at least in part on the subset of dictionaries (e.g., common dictionaries), at the near end in relation to a video session associated with a near-end terminal and a far-end terminal. The encoder component can use the subset of dictionaries to encode the video content using sparse coding. The encoder component can transmit the encoded video content to the decoder component at the far-end terminal. The decoder component can use the corresponding (e.g., decoder-side) dictionary(ies) from the subset of dictionaries to decode and reconstruct the encoded video content. The reconstructed video content can be provided to the display component of the far-end terminal for presentation to a user viewing the far-end terminal.

Figure 7:
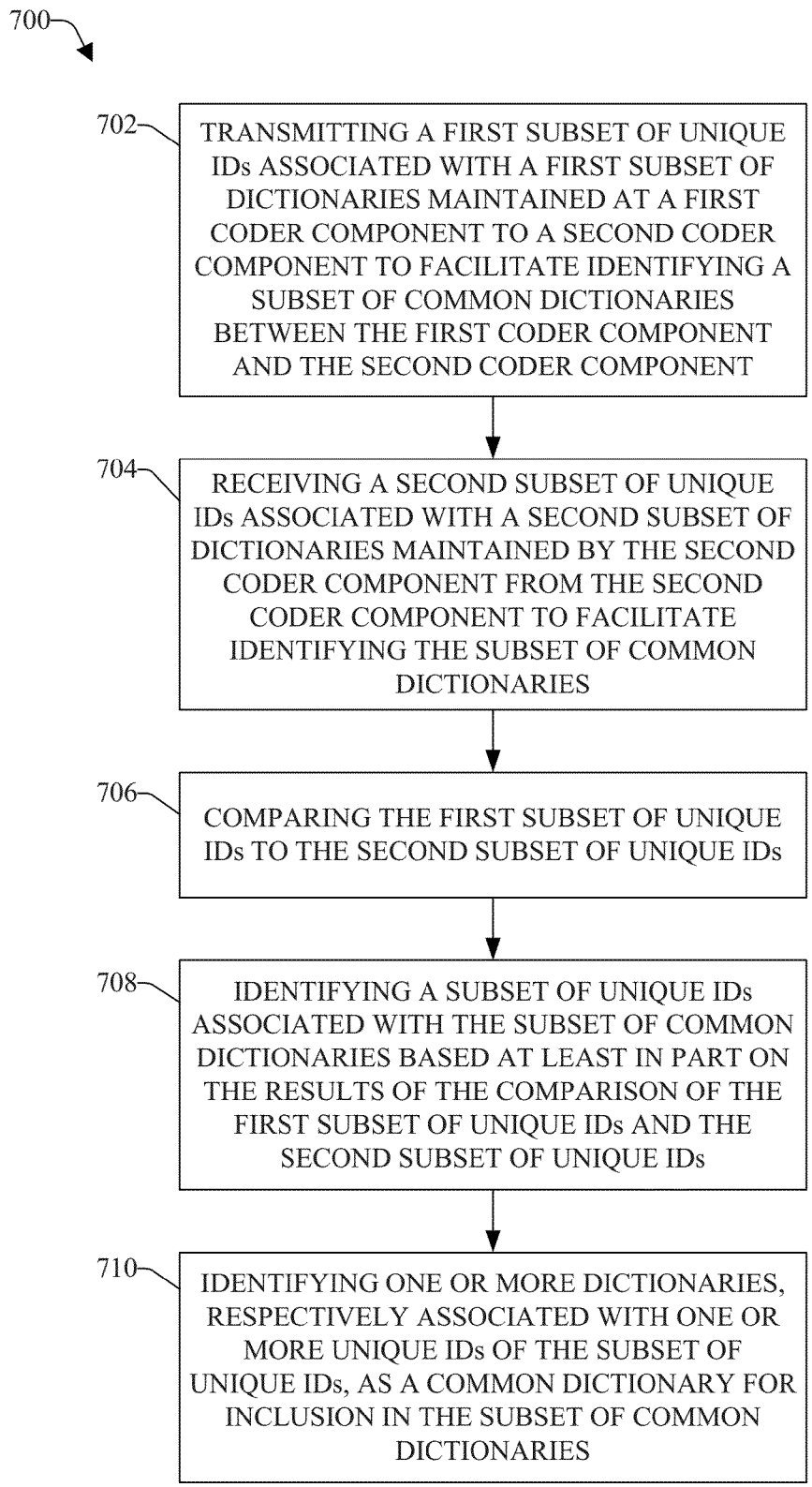
FIG. 7 depicts a flow chart of an example method for identifying common dictionaries between an encoder component and a decoder component at respective ends of a video session to facilitate efficiently encoding video content associated with the video session using sparse coding, in accordance with various aspects and implementations.

Referring next to FIG. 7, depicted is a flow chart of an example method 700 for identifying common dictionaries between an encoder component and a decoder component at respective ends of a video session to facilitate efficiently encoding (e.g., sparse coding) video content associated with the video session using sparse coding, in accordance with various aspects and implementations. The method 700 can be used, for example, by an encoder component at one end of the video session (e.g., video conference session) and/or a decoder component at the other end of the video session. A common dictionary can be used to facilitate encoding video frames (at the encoder end) or decoding the encoded video frames (at the decoder end) associated with the video session.

At 702, a first subset of unique IDs associated with a first subset of dictionaries maintained at a first coder component can be transmitted to a second coder component to facilitate identifying a subset of common dictionaries between the first coder component and the second coder component. The respective dictionary management components of the first coder component and the second coder component can exchange information, including unique IDs, relating to their respective dictionaries with each other to facilitate synchronizing with each other to identify the subset of common dictionaries. Each dictionary can have a unique ID associated with (e.g., assigned to) it. In some implementations, the first coder component can be an encoder component and the second coder component can be a decoder component. In other implementations, the first coder component can be the decoder component and the second coder component can be the encoder component. The first coder component and second coder component can be at respective ends (e.g., near end, far end) of the video session and can be associated with respective terminals that can be used to present (e.g., display) video content to viewers.

At 704, a second subset of unique IDs associated with a second subset of dictionaries maintained by the second coder component can be received from the second coder component to facilitate identifying the subset of common dictionaries. The first coder component can receive the second subset of unique IDs from the second coder component.

At 706, the first subset of unique IDs can be compared to the second subset of unique IDs. A dictionary management component (e.g., associated with the first coder component, or associated with the second coder component) can compare the first subset of unique IDs to the second subset of unique IDs to facilitate identifying the subset of common dictionaries (e.g., common dictionaries that are identical to corresponding dictionaries of the decoder component at the other end of the video session).

At 708, a subset of unique IDs associated with the subset of common dictionaries can be identified (e.g., by a dictionary management component) based at least in part on the results of the comparison of the first subset of unique IDs and the second subset of unique IDs. For example, the dictionary management component can compare the first and second subsets of unique IDs and can identify one or more unique IDs that are both in the first subset of unique IDs and the second subset of unique IDs. The dictionary management component can include (e.g., insert) a unique ID in the subset of unique IDs in response to determining that such unique ID is in both the first subset of unique IDs and the second subset of unique IDs.

At 710, one or more dictionaries respectively associated with one or more unique IDs of the subset of unique IDs can be identified as a common dictionary and can be included in the subset of common dictionaries. The dictionary management component can identify one or more dictionaries associated with the one or more respective unique IDs of the subset of unique IDs as a common dictionary, based at least in part on the subset of unique IDs, and can include (e.g., insert) the one or more dictionaries in the subset of common dictionaries.

The encoder component can use the subset of common dictionaries to efficiently encode video content using sparse coding, and can transmit the encoded video content to the decoder component. The decoder component can use its corresponding subset of common dictionaries to efficiently decode and reconstruct the encoded video content. The decoder component can communicate the reconstructed video content to a display component of the terminal associated with the decoder component. The display component can present (e.g., display) the reconstructed video content to a user.

Figure 8:
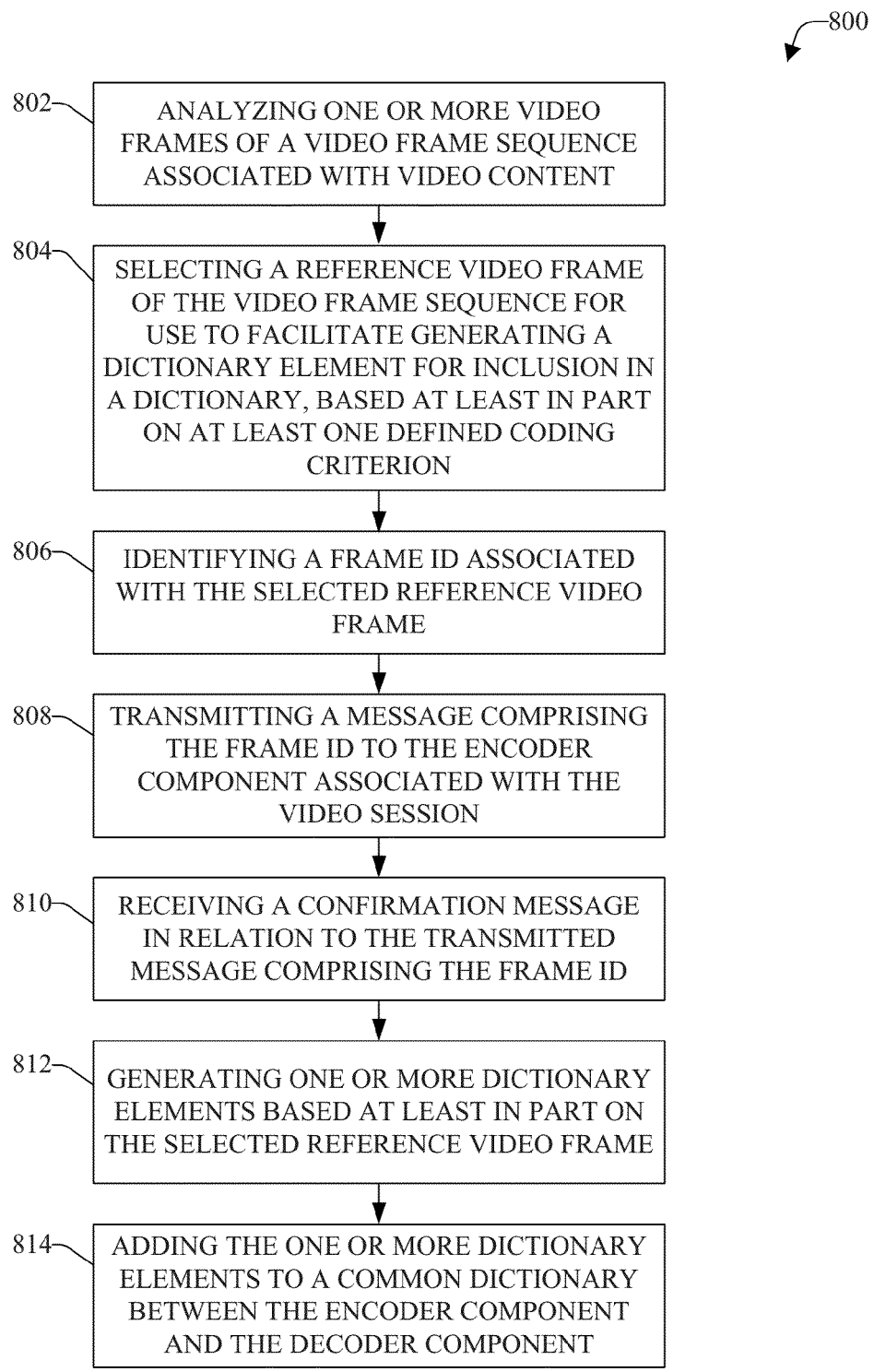
FIG. 8 depicts a flow chart of an example method for identifying reference video frames, which are contained in a video frame sequence associated with a video session, for use in a coding dictionary to facilitate efficient coding (e.g., sparse coding) of video content, in accordance with various aspects and implementations.

FIG. 8 depicts a flow chart of an example method 800 for identifying reference video frames, which are contained in a video frame sequence associated with a video session, for use in generating dictionary elements that can be included in an existing or new common coding dictionary to facilitate efficient coding of video content, in accordance with various aspects and implementations. The method 800 can be used, for example, by a decoder component, to generate dictionary elements that can be added to a new or existing dictionary to facilitate efficiently decoding encoded video content using sparse coding. The decoder component can receive encoded video content from an encoder component that can be using a corresponding (e.g., common) dictionary. The decoder component can use the new or existing (e.g., common) dictionary to efficiently decode the encoded video content.

At 802, one or more video frames of a video frame sequence associated with video content can be analyzed (e.g., by a decoder component). The decoder component can analyze video frames of the video frame sequence to facilitate identifying candidate reference video frames that can be used in a dictionary or used to generate dictionary elements that can be included in the dictionary to facilitate using sparse coding in relation to coding of video content. The decoder component associated with a terminal at one end of a video session. An encoder component can be associated with another terminal at the other end of the video session.

At 804, a reference video frame of the video frame sequence can be selected for use to facilitate generating a dictionary element for inclusion in a dictionary, based at least in part on at least one defined coding criterion. The dictionary management component of the decoder component can select the reference video frame when the dictionary management component determines that the selected video frame is a desirable video frame for use in generating dictionary elements, in accordance with the defined coding criterion. The defined coding criterion can relate to, for example, quality of the visual image in the video frame or detected changes in the scene associated with the visual image (e.g., detected scene changes from frame to frame). For example, the defined coding criterion can specify that a visual image, which has a defined portion of the visual image that does not change (or does not change substantially) over a subset of video frames of the sequence, can be selected to be a reference video frame.

At 806, a frame ID associated with the selected reference video frame can be identified. The dictionary management component can identify a frame ID associated with the selected video frame. Each video frame of the video frame sequence can be associated with a unique frame ID. The frame ID can be assigned to the video frame by the encoder component (e.g., dictionary management component associated therewith) or the decoder component (e.g., dictionary management component associated therewith).

At 808, a message comprising the frame ID can be transmitted to the encoder component associated with the video session. The dictionary management component of the decoder component can transmit a message that includes the frame ID associated with the selected video frame to the encoder component (e.g., a respective dictionary management component associated therewith). At 810, a confirmation message in relation to the transmitted message, comprising the frame ID, can be received. The dictionary management component of the decoder component can receive a confirmation message from the encoder component indicating that the encoder component received the message comprising the frame ID. In some implementations, the encoder component and decoder component can communicate the messages via a secured communication channel, as more fully disclosed herein.

At 812, one or more dictionary elements can be generated based at least in part on the selected reference video frame. The dictionary management component of the decoder component can analyze the reference video frame and can generate one or more dictionary elements that can be added to a new or existing common dictionary associated with the decoder component (and its associated terminal) and encoder component (and its associated terminal). The one or more dictionary elements can facilitate decoding encoded video content using sparse coding in relation to a video session (e.g., current or future session) associated with the encoder component and decoder component. In some implementations, the dictionary management component can apply a training algorithm that can facilitate generating the one or more dictionary elements based at least in part on the selected reference video frame.

At 814, the one or more dictionary elements can be added to a common dictionary between the encoder component and the decoder component. The dictionary management component can add the one or more dictionary elements to the common dictionary, which can be a new or existing dictionary. The common dictionary can be a dictionary that is common to both the encoder component and decoder component. The common dictionary can include a subset of dictionary elements, including the one or more added dictionary elements.

If the dictionary is a new dictionary, the dictionary management component of the decoder component can assign a unique ID to the new dictionary based at least in part on defined coding criterion relating to unique IDs. In some implementations, the dictionary management component of the decoder component can generate and assign a unique ID to the new dictionary and transmit the unique ID to the encoder component so that the encoder component can assign the same unique ID to its corresponding new dictionary. In other implementations, the dictionary management component of the decoder component can receive a unique ID from the encoder component and can assign the unique ID to the new dictionary. In still other implementations, the respective dictionary management components of the encoder and decoder components can generate and assign a same unique ID to the respective corresponding new dictionaries in accordance with defined coding criterion relating to the generation and assignment of unique IDs. The dictionary management component can use a unique ID algorithm to generate and/or assign a unique ID to a new dictionary.

The decoder component can use the common dictionary, including the added dictionary element(s), to decode encoded video content received from the encoder component during the current video session or during a subsequent video session associated with that encoder component (e.g., the terminal associated with the encoder component). To use the added dictionary element during a video session (e.g., current or subsequent video session), the dictionary management component of the decoder component can exchange a message(s) with the dictionary management component of the encoder component to facilitate synchronizing (e.g., re-synchronizing) the corresponding common dictionaries in relation to the addition of the dictionary element (e.g., on both the encoder and decoder end). In some implementations, the respective dictionary management components of the decoder and encoder components can synchronize the corresponding common dictionaries, based at least in part on the frame ID or other identifier associated with an added dictionary element or the common dictionaries, to reflect (e.g., confirm) the addition of the dictionary element to those common dictionaries during the current video session or a subsequent video session. Once the corresponding common dictionaries have been synchronized, the respective dictionary management components can use the updated corresponding common dictionaries, including the corresponding added dictionary elements, for coding of video content during the video session.

Figure 9:
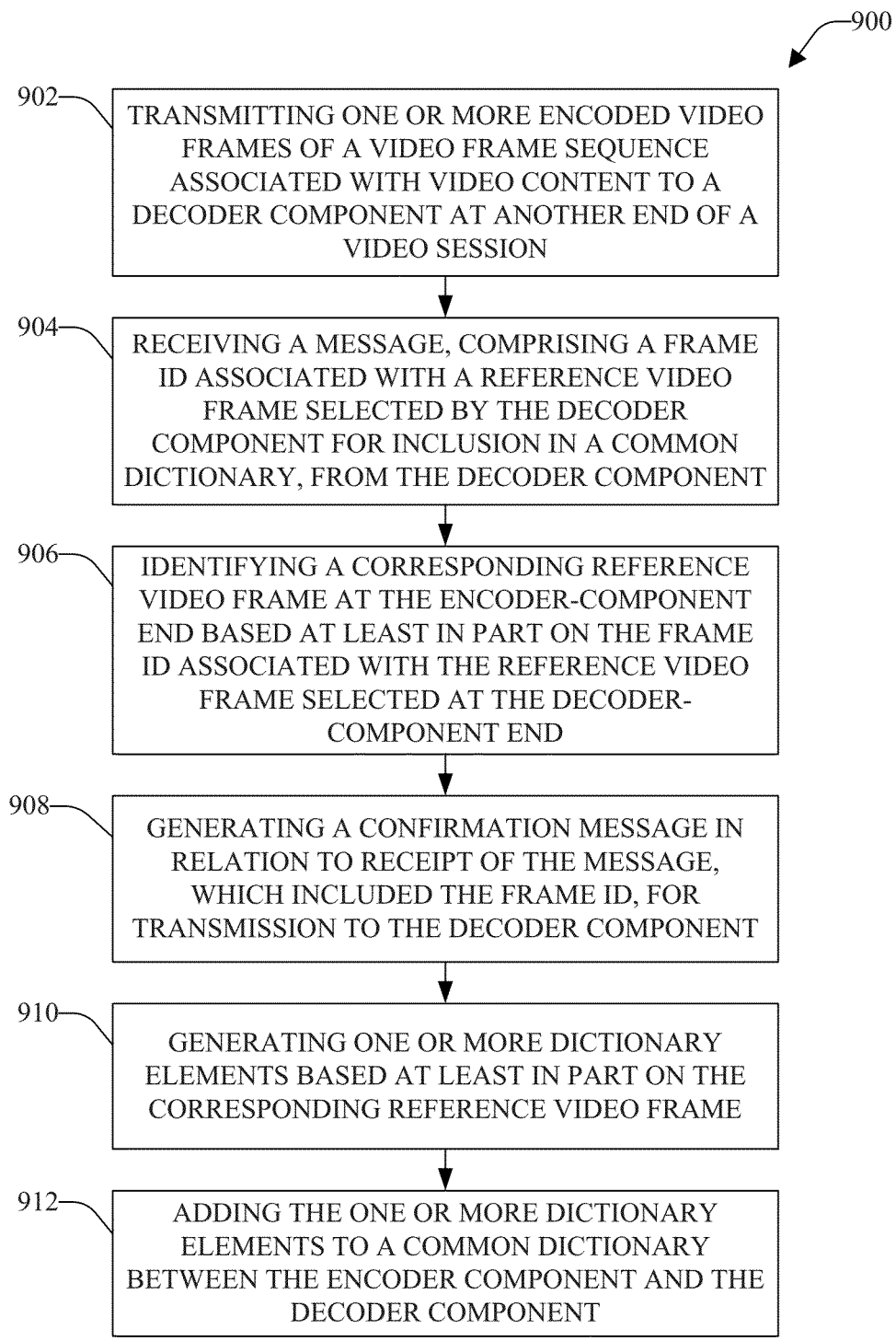
FIG. 9 illustrates a flow chart of another example method for identifying reference video frames, contained in a video frame sequence associated with a video session, for use in a coding dictionary to facilitate efficient coding (e.g., sparse coding) of video content, in accordance with various aspects and implementations.

FIG. 9 illustrates a flow chart of another example method 900 for identifying reference video frames, contained in a video frame sequence associated with a video session, for use in generating new dictionary elements that can be included in a new or existing common coding dictionary to facilitate efficient coding of video content, in accordance with various aspects and implementations. The method 900 can be used, for example, by an encoder component, to generate dictionary elements that can be added to a new or existing dictionary to facilitate efficiently encoding video content using sparse coding during a video session. The dictionary can be a dictionary that is common to a corresponding dictionary maintained by a decoder component, which can be associated with a far-end terminal that is associated with the video session. The encoder component can transmit the encoded video content to the decoder component, and the decoder component can decode the encoded video content using a corresponding common dictionary.

At 902, one or more encoded video frames of a video frame sequence associated with video content can be transmitted to a decoder component at another end of the video session. The encoder component can be associated with a terminal at one end of a video session. The encoder component can encode and transmit the one or more encoded video frames to the decoder component associated with another terminal at the other end of the video session.

At 904, a message, comprising a frame ID associated with a reference video frame of the video session selected by the decoder component for inclusion in a common dictionary, can be received from the decoder component. The dictionary management component of the encoder component can receive the message including the frame ID from the decoder component at the other end of the video session. The frame ID can be associated with a reference video frame from the video session that was selected by the decoder component to be used to generate a dictionary element for use in sparse coding of video content, in accordance with defined coding criterion.

At 906, the corresponding reference video frame at the encoder-component end can be identified based at least in part on the frame ID associated with the reference video frame selected at the decoder-component end. The dictionary management component of the encoder component can analyze the video frames associated with the video session maintained at the encoder component, and can identify the reference video frame at the encoder-component end that corresponds to the reference video frame selected by the decoder component, based at least in part on the frame ID.

At 908, a confirmation message in relation to receipt of the message, which included the frame ID, can be generated and transmitted to the decoder component. The dictionary management component can generate the confirmation message and can transmit the confirmation message to the decoder component to indicate to the decoder component that the encoder component received the message comprising the frame ID. In some implementations, the encoder component and decoder component can communicate the respective messages via a secured communication channel, as more fully disclosed herein.

At 910, one or more dictionary elements can be generated based at least in part on the corresponding reference video frame. The dictionary management component of the encoder component can analyze the corresponding reference video frame and generate one or more dictionary elements that can be added to a new or existing common dictionary associated with the encoder component (and its associated terminal) and decoder component (and its associated terminal). The one or more dictionary elements can facilitate encoding video content using sparse coding in relation to a video session (e.g., current or future session) associated with the encoder component and decoder component. In some implementations, the dictionary management component can apply a training algorithm that can facilitate generating the one or more dictionary elements based at least in part on the corresponding reference video frame.

At 912, the one or more dictionary elements can be added to a common dictionary between the encoder component and the decoder component. The dictionary management component of the encoder component can add the one or more dictionary elements to the common dictionary, which can be a new or existing dictionary. The common dictionary can be a dictionary that is common to both the encoder component and decoder component. The common dictionary can include a subset of dictionary elements, including the added dictionary element. As more fully disclosed herein, the respective dictionary management components of the encoder and decoder components can synchronize dictionaries (e.g., common dictionaries), including updates to such dictionaries (e.g., additions or deletions of dictionary elements), at desired times (e.g., beginning or during a video session). The encoder and decoder components can use the synchronized common dictionaries to facilitate efficient sparse coding of video content during a video session involving the encoder component and decoder component.

Figure 10:
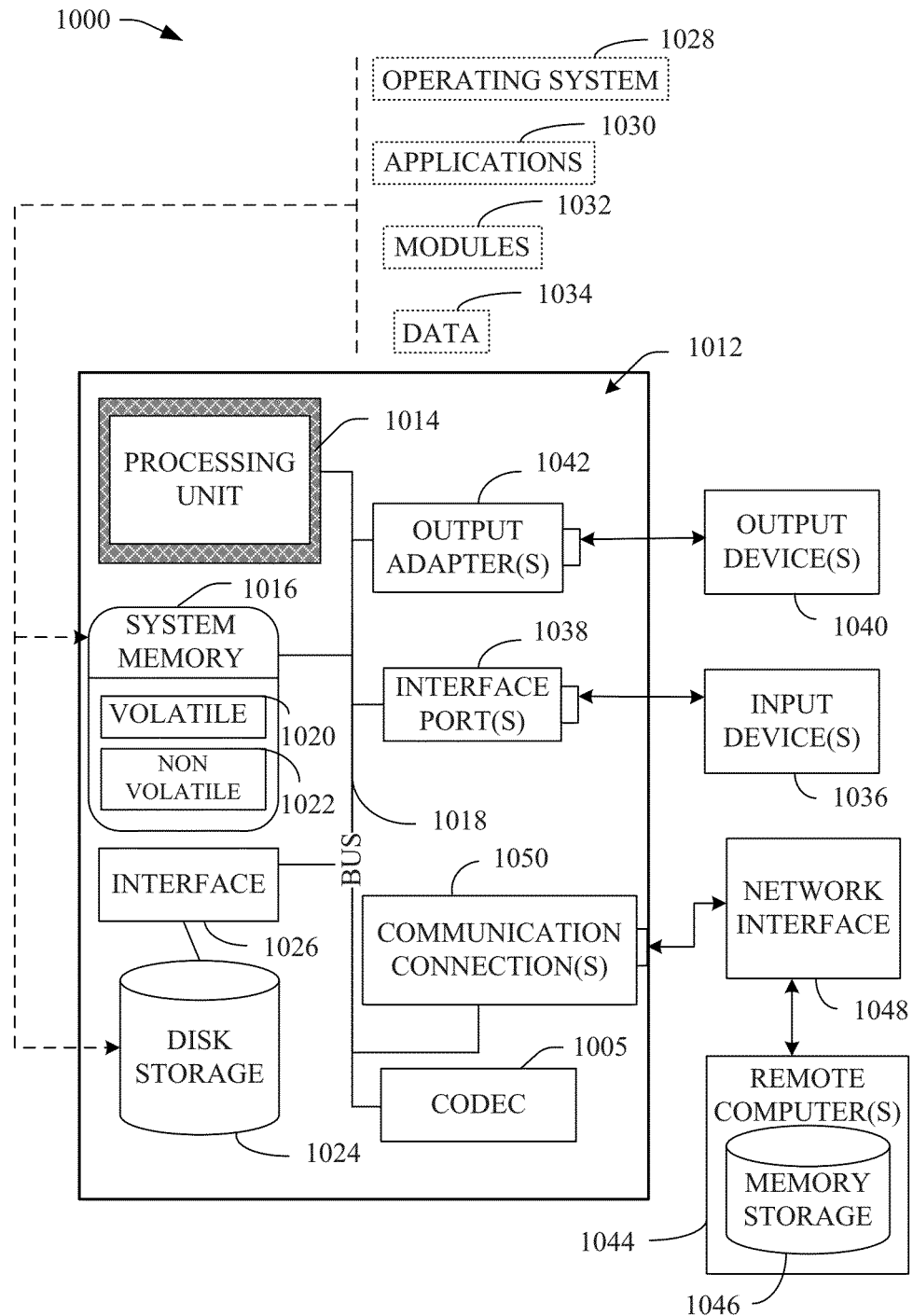
FIG. 10 is a schematic block diagram illustrating a suitable operating environment.
Figure 11:
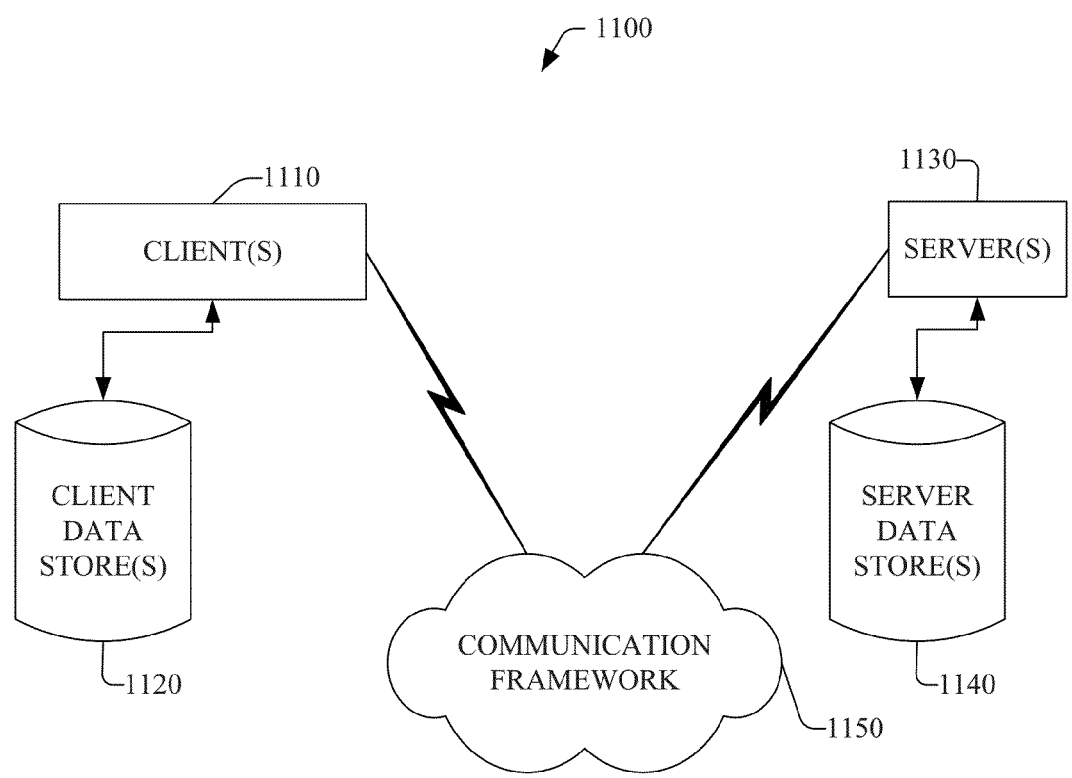
FIG. 11 is a schematic block diagram of a sample-computing environment.

In order to provide a context for the various aspects of the disclosed subject matter, FIGS. 10 and 11 as well as the following discussion are intended to provide a brief, general description of a suitable environment in which the various aspects of the disclosed subject matter may be implemented.

With reference to FIG. 10, a suitable operating environment 1000 for implementing various aspects of this disclosure includes a computer 1012. The computer 1012 includes a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1020 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 also includes removable/non-removable, volatile/nonvolatile computer storage media. FIG. 10 illustrates, for example, a disk storage 1024. Disk storage 1024 includes, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used, such as interface 1026.

FIG. 10 also depicts software that acts as an intermediary between users and the basic computer resources described in the suitable operating environment 1000. Such software includes, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems.

A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

In accordance with various aspects and implementations, the computer 1012 can be used to encode data, such as digital media data, which can be in the form of a sequence of video frames. As more fully disclosed herein, in some implementations, the computer 1012 can include a plurality of processors that can be used to process data and perform computing tasks (e.g., encoding-related tasks and/or decoding-related tasks, etc.). In certain exemplary embodiments, the computer 1012 includes a codec 1005 that can contain, for example, an encoder component and/or decoder component, each of which can respectively function as more fully disclosed herein. The codec 1005 can perform various encoding and/or decoding tasks (e.g., coding video frames (e.g., based on sparse coding), identifying common dictionaries for use in coding of video content, generating dictionary elements, generating or modifying dictionaries, identifying video frames to use to generate dictionary elements, etc.) on data (e.g., sequentially or in parallel).

FIG. 11 is a schematic block diagram of a sample-computing environment 1100 with which the subject matter of this disclosure can interact. The sample-computing environment 1100 includes one or more client(s) 1110. The client(s) 1110 can be hardware and/or software (e.g., threads, processes, computing devices). The sample-computing environment 1100 also includes one or more server(s) 1130. Thus, sample-computing environment 1100 can correspond to a two-tier client server model or a multi-tier model (e.g., client, middle tier server, data server), amongst other models. The server(s) 1130 can also be hardware and/or software (e.g., threads, processes, computing devices). The servers 1130 can house threads to perform transformations by employing this disclosure, for example. One possible communication between a client 1110 and a server 1130 may be in the form of a data packet transmitted between two or more computer processes.

The sample-computing environment 1100 includes a communication framework 1150 that can be employed to facilitate communications between the client(s) 1110 and the server(s) 1130. The client(s) 1110 are operatively connected to one or more client data store(s) 1120 that can be employed to store information local to the client(s) 1110. Similarly, the server(s) 1130 are operatively connected to one or more server data store(s) 1140 that can be employed to store information local to the servers 1130.

It is to be appreciated and understood that components (e.g., encoder component, codec, decoder component, dictionary management component, etc.), as described with regard to a particular system or method, can include the same or similar functionality as respective components (e.g., respectively named components or similarly named components) as described with regard to other systems or methods disclosed herein.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multi-processor computer systems, mini-computing devices, mainframe computers, as well as personal computers, hand-held computing devices (e.g., PDA, phone, tablet), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

What has been described above includes examples of systems and methods that provide advantages of this disclosure. It is, of course, not possible to describe every conceivable combination of components or methods for purposes of describing this disclosure, but one of ordinary skill in the art may recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system for encoding video content, comprising:
   at least one memory that stores computer executable components; and
   at least one processor that executes the following computer executable components stored in the at least one memory:
     a near-end encoder component configured to encode the video content; and
     a near-end dictionary management component configured to identify one or more dictionaries that the near-end encoder component has in common with a far-end decoder component to synchronize common dictionaries between the near-end encoder component and the far-end decoder component, based at least in part on respective unique identifiers associated with respective dictionaries, to facilitate the encoding of the video content, wherein the one or more dictionaries are sparse coding dictionaries, wherein the near-end dictionary management component is further configured to generate a unique identifier, of the respective unique identifiers, wherein the unique identifier is configured to contain a first tier comprising respective terminal addresses of a near-end terminal associated with the near-end encoder component and a far-end terminal associated with the far-end decoder component, and a second tier comprising a dictionary sub-identifier assigned to a dictionary associated with the unique identifier, to facilitate distinguishing the dictionary from other dictionaries associated with the near-end terminal and the far-end terminal.

2. The system of claim 1, wherein the near-end dictionary management component is further configured to transmit a first subset of unique identifiers associated with a first subset of dictionaries maintained by the near-end encoder component to the far-end decoder component to facilitate the synchronization of the common dictionaries.

3. The system of claim 2, wherein the near-end dictionary management component is further configured to receive a second subset of unique identifiers associated with a second subset of dictionaries maintained by the far-end decoder component from the far-end decoder component to facilitate the synchronization of the common dictionaries.

4. The system of claim 3, further comprising a near-end synchronizer component configured to identify a unique identifier that is contained in the first subset of unique identifiers and the second subset of unique identifiers, and, in response to identifying the unique identifier as being contained in the first subset of unique identifiers and the second subset of unique identifiers, identify a dictionary associated with the unique identifier as a common dictionary.

5. The system of claim 4, wherein the near-end encoder component is further configured to use the common dictionary to facilitate the encoding of the video content, wherein the common dictionary is configured to facilitate sparse coding of the video content by the near-end encoder component.

6. The system of claim 1, further comprising a near-end dictionary generator component configured to at least one of generate a new common dictionary or modify a common dictionary, associated with the near-end encoder component and the far-end decoder component, based at least in part on one or more corresponding reference video frames associated with a video session associated with the near-end encoder component and the far-end decoder component, wherein the new common dictionary or the common dictionary comprise one or more new dictionary elements.

7. The system of claim 6, further comprising a near-end identifier component configured to receive one or more reference-frame identifiers from the far-end decoder component and identify the one or more corresponding reference video frames at the near-end encoder component that are associated with the one or more reference-frame identifiers, wherein the one or more reference-frame identifiers are respectively associated with one or more reference video frames selected by the far-end decoder component for use in generating the one or more new dictionary elements to be included in the new common dictionary or the common dictionary being modified.

8. The system of claim 7, wherein the near-end dictionary management component is further configured to receive the one or more reference-frame identifiers from the far-end decoder component via a secured communication channel.

9. The system of claim 6, wherein the near-end dictionary generator component is further configured to generate the new common dictionary or modify the common dictionary during the video session.

10. The system of claim 6, wherein the near-end dictionary generator component is further configured to generate the new common dictionary or modify the common dictionary after the video session is completed.

11. A method for encoding video content, comprising:
   employing at least one processor to facilitate execution of code instructions retained in at least one memory device, the at least one processor, in response to execution of the code instructions, perform acts comprising:
     identifying a subset of dictionaries that a near-end encoder has in common with a far-end decoder to synchronize common dictionaries between the near-end encoder and the far-end decoder, based at least in part on respective unique identifiers associated with respective dictionaries of the near-end encoder and the far-end decoder;
     generating a unique identifier, of the respective unique identifiers, that contains a terminal address field comprising respective terminal address values of a near-end terminal associated with the near-end encoder and a far-end terminal associated with the far-end decoder, and a dictionary sub-identifier field comprising a dictionary sub-identifier value assigned to a dictionary associated with the unique identifier, to facilitate distinguishing the dictionary from other dictionaries associated with the near-end terminal and the far-end terminal; and encoding the video content using sparse coding suing the subset of dictionaries as sparse coding dictionaries.

12. The method of claim 11, further comprising:

identifying a first subset of unique identifiers associated with a first subset of dictionaries maintained at the near-end encoder to facilitate the synchronizing of the common dictionaries; and receiving a second subset of unique identifiers associated with a second subset of dictionaries maintained by the far-end decoder from the far-end decoder to facilitate the synchronizing of the common dictionaries.

13. The method of claim 11, further comprising:

receiving one or more frame identifiers respectively associated with one or more reference video frames selected by the far-end decoder to be used to generate one or more new dictionary elements, wherein the one or more reference video frames are selected from a video session associated with the near-end encoder and the far-end decoder; and identifying one or more corresponding reference video frames at a near end of the video session based at least in part on the one or more frame identifiers, wherein the one or more corresponding reference video frames correspond to the one or more reference video frames selected by the far-end decoder.

14. The method of claim 13, further comprising:

establishing a secured communication channel between the near-end encoder and the far-end decoder; and receiving the one or more frame identifiers via the secured communication channel.

15. The method of claim 13, further comprising:

generating one or more corresponding new dictionary elements based at least in part on the one or more corresponding reference video frames, wherein the one or more corresponding new dictionary elements correspond to one or more new dictionary elements generated by the far-end decoder; and at least one of generating a new common dictionary that includes the one or more corresponding new dictionary elements or modifying a common dictionary to include the one or more corresponding new dictionary elements, wherein the new common dictionary or the common dictionary are part of the subset of dictionaries.

16. A system for decoding encoded video content, comprising:

at least one memory that stores computer executable components; and at least one processor that executes the following computer executable components stored in the at least one memory:

a far-end decoder component configured to decode the encoded video content received from a near-end encoder component; and a far-end dictionary management component configured to identify one or more dictionaries that the far-end decoder component has in common with the near-end encoder component to synchronize common dictionaries between the far-end decoder component and the near-end encoder component, based at least in part on respective unique identifiers associated with respective dictionaries, to facilitate the decoding of the encoded video content, wherein the one or more dictionaries are sparse coding dictionaries, wherein the far-end dictionary management component is further configured to generate a unique identifier, of the respective unique identifiers, wherein the unique identifier is configured to contain a first tier comprising respective terminal addresses of a near-end terminal associated with the near-end encoder component and a far-end terminal associated with the far-end decoder component, and a second tier comprising a dictionary sub-identifier assigned to a dictionary associated with the unique identifier, to facilitate distinguishing the dictionary from other dictionaries associated with the near-end terminal and the far-end terminal.

17. The system of claim 16, wherein the far-end dictionary management component is further configured to receive from the near-end encoder component a first subset of unique identifiers associated with a first subset of dictionaries maintained by the near-end encoder component, and transmit to the near-end encoder component a second subset of unique identifiers associated with a second subset of dictionaries maintained by the far-end decoder component, to facilitate the synchronization of the common dictionaries.

18. The system of claim 17, further comprising a far-end synchronizer component configured to identify a unique identifier that is contained in the first subset of unique identifiers and the second subset of unique identifiers, and, in response to identifying the unique identifier as being contained in the first subset of unique identifiers and the second subset of unique identifiers, identify a dictionary associated with the unique identifier as a common dictionary.

19. The system of claim 18, wherein the far-end decoder component is further configured to use the common dictionary to facilitate the decoding of the video content, wherein the common dictionary is configured to facilitate sparse coding of the video content.

20. The system of claim 16, further comprising a far-end dictionary generator component configured to at least one of generate a new common dictionary or modify a common dictionary, associated with the far-end decoder component and the near-end encoder component, based at least in part on one or more reference video frames associated with the far-end decoder component and the near-end encoder component in relation to a video session, wherein the new common dictionary or the common dictionary comprise one or more new dictionary elements.

21. The system of claim 20, wherein the far-end dictionary generator component is further configured to identify one or more video frames from the video session for use as the one or more reference video frames to facilitate generation of one or more dictionary elements, based at least in part on defined coding criterion the defined coding criterion relating to at least one of quality of a visual image of a video frame or an amount of change detected in a visual scene depicted in a subset of video frames.

22. The system of claim 21, further comprising a far-end identifier component configured to identify one or more frame identifiers respectively associated with the one or more reference video frames.

* * * * *